(12) United States Patent
Deeg et al.

(10) Patent No.: US 12,130,344 B2
(45) Date of Patent: Oct. 29, 2024

(54) PARALLELIZED MAGNETIC SENSING OF SAMPLES USING SOLIDSTATE SPIN SYSTEMS

(71) Applicant: TECHNISCHE UNIVERSITÄT MÜNCHEN, Munich (DE)

(72) Inventors: Andreas Deeg, Munich (DE); Dominik Bucher, Puchheim (DE)

(73) Assignee: TECHNISCHE UNIVERSITÄT MÜNCHEN, Munich (DE)

( * ) Notice: Subject to any disclaimer, the term of this patent is extended or adjusted under 35 U.S.C. 154(b) by 67 days.

(21) Appl. No.: 17/996,631

(22) PCT Filed: Apr. 23, 2021

(86) PCT No.: PCT/EP2021/060736
§ 371 (c)(1),
(2) Date: Oct. 20, 2022

(87) PCT Pub. No.: WO2021/219516
PCT Pub. Date: Nov. 4, 2021

(65) Prior Publication Data
US 2023/0204695 A1      Jun. 29, 2023

(30) Foreign Application Priority Data

Apr. 29, 2020   (EP) ..................... 20172145

(51) Int. Cl.
*G01V 3/00*    (2006.01)
*G01R 33/30*   (2006.01)
(Continued)

(52) U.S. Cl.
CPC ........... *G01R 33/323* (2013.01); *G01R 33/30* (2013.01); *G01N 21/64* (2013.01); *G01N 24/10* (2013.01)

(58) Field of Classification Search
CPC . G01N 24/10; G01R 29/0807; G01R 33/4608
(Continued)

(56) References Cited

U.S. PATENT DOCUMENTS

| 5,616,922 A | 4/1997 | Reffner et al. |
| 10,197,515 B2 | 2/2019 | Clevenson et al. |
| 2019/0145919 A1 | 5/2019 | Clevenson et al. |

FOREIGN PATENT DOCUMENTS

| CN | 101632018 A | * | 1/2010 | ............. B82Y 25/00 |
| EP | 1281969 A2 | | 2/2003 | |

(Continued)

OTHER PUBLICATIONS

Yeung, et al., "Anti-Reflection Coating for Nitrogen-Vacancy Optical Measurements in Diamond", Digital Access to Scholarship at Harvard, http://nrs.harvard.edu/ur-3:HUL.InstRepos:11878775, Applied Physics Letters 100, 251111 2012, pp. 251111-1-251111-4.

(Continued)

*Primary Examiner* — Walter L Lindsay, Jr.
*Assistant Examiner* — Frederick Wenderoth
(74) *Attorney, Agent, or Firm* — Grossman, Tucker, Perreault & Pfleger, PLLC

(57) ABSTRACT

Disclosed herein is a sensor chip for parallelized magnetic sensing of a plurality of samples, a system for parallelized magnetic sensing of a plurality of samples and a method for probing a plurality of samples using optically addressable solid-state spin systems. The sensor chip comprises an optically transparent substrate comprising a plurality of optically addressable solid-state spin systems arranged in a plurality of sensing regions in a surface layer below a top surface of the substrate. The sensor chip further comprises a plurality of sample sites, wherein each sample site is arranged above a respective sensing region. The sensor chip has a light guiding system configured to provide an optical (Continued)

Figure 1:
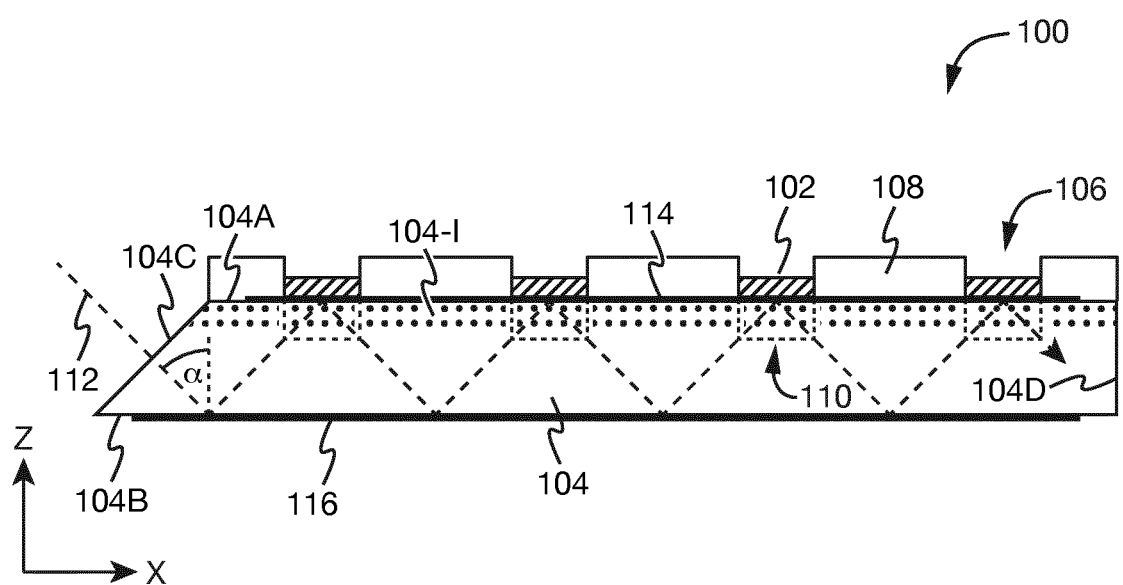

path through the substrate connecting each of the sensing regions.

15 Claims, 8 Drawing Sheets

(51) Int. Cl.
  *G01R 33/32* (2006.01)
  *G01N 21/64* (2006.01)
  *G01N 24/10* (2006.01)
(58) Field of Classification Search
  USPC .......................................................... 324/304
  See application file for complete search history.

(56) References Cited

FOREIGN PATENT DOCUMENTS

| | | | |
|---|---|---|---|
| GB | 2483767 A | 3/2012 | |
| WO | 2018052497 A2 | 3/2018 | |
| WO | WO-2018128543 A1 * | 7/2018 | ............. G01R 33/30 |

OTHER PUBLICATIONS

Riedel, et al., "Deterministic Enhancement of Coherent Photon Generation from a Nitrogen-Vacancy Center in Ultrapure Diamond", Department of Physics, University of Basel, Klingelbergstrasse 82, Basel CH-4056, Switzerland, Dated Mar. 6, 2022.
Hiscocks, et al., "Diamond Waveguides Fabricated by Reactive Ion Etching", Optics Express, vol. 16, No. 24, 2008, pp. 19512-19519.
Zhu, et al., "Fabrication of Diamond Microlenses by Chemical Reflow Method", Research Article, vol. 25, No. 2, 2017, Optics Express, pp. 1185-1192.
Choi, et al., "Fabrication of Natural Diamond Microlenses by Plasma Etching", Journal of Vacuum Science & Technology B, vol. 23, No. 1, 2005, pp. 130-132.
Bucher, et al., "High Resolution Magnetic Resonance Spectroscopy Using Solid-State Spins", Digital Access to Scholarship at Harvard, http://nrs.harvard.edu/um-3:HUL.InstRepos:40986321, Nature 555, pp. 351-354, 2018.
Hall, et al., "High Spatial and Temporal Resolution Wide-Field Imaging of Neuron Activity using Quantum NV-Diamond", Scientific Reports, 2, 401, 2012, pp. 1-9.
Zhang, et al., "Large Cross-Section Edge-Coupled Diamond Waveguides", Diamond & Related Materials 20, 2011, pp. 564-567.
Horsley, et al., "Microwave Device Characterization Using a Widefield Diamond Microscope", Physical Review Applied 10, 044039, 2018, pp. 1-10.
Devience, et al., "Nanoscale NMR Spectroscopy and Imaging of Multiple Nuclear Species", Nature Nanotechnology, vol. 10, 2015, pp. 129-134.
Mamin, et al., "Nanoscale Nuclear Magnetic Resonance with a Nitrogen-Vacancy Spin Sensor", Science Magazine vol. 339, 2013, pp. 557-559.
Boretti, et al., "Nitrogen-Vacancy Centers in Diamond for Nanoscale Magnetic Resonance Imaging Applications", Beilstein Journal of Nanotechnology, vol. 10, 2019, pp. 2128-2151.
Lovchinsky, et al., "Nuclear Magnetic Resonance Detection and Spectroscopy of Single Proteins using Quantum Logic", Science Magazine, vol. 351, Issue 6275, 2016, pp. 836-841.
Nuclear Magnetic Resonance Spectrometer (NMR) (NMR Spectrometer) Market 2019 Global Industry Demand, Recent Trends, Size and Share Estimation by 2024 with Top Players—MarketReportsWorld.com, Global Banking & Finance Review, 2019, pp. 1-6.
Staudacher, et al., "Nuclear Magnetic Resonance Spectroscopy on a (5-Nanometer)3 Sample Volume", Science Magazine, vol. 339, 2013, pp. 561-563.
Bougas, et al., "On the Possibility of Miniature Diamond-Based Magnetometers Using Waveguide Geometries", Micromachines, vol. 9, No. 276, 2018, pp. 1-11.
Barry, et al., "Optical Magnetic Detection of Single-Neuron Action Potentials using Quantum Defects in Diamond", PNAS, vol. 113, No. 49, 2016, pp. 14133-14138.
Sage, et al., "Optical Magnetic Imaging of Living Cells", Nature, Letter Research, vol. 496, 2013, pp. 486-489.
Toros, et al., "Precision Micro-Mechanical Components in Single Crystal Diamond by Deep Reactive Ion Etching", Microsystems & Nanoengineering, vol. 4, No. 12, 2018, pp. 1-8.
Bucher, et al., "Quantum Diamond Spectrometer for Nanoscale NMR and ESR Spectroscopy", Harvard-Smithsonian Center for Astrophysics in Cambridge MA, Department of Physics in Harvard University in Cambridge MA.
Tetienne, et al., "Quantum Imaging of Current Flow in Graphene", Centre for Quantum Computation and Communication Technology & School of Physics & Centre for Neural Engineering at University of Melbourne in Parkville Australia.
Zhang, et al., "Selective Addressing of Solid-State Spins at the Nanoscale via Magnetic Resonance Frequency Encoding", Nature Partner Journals, Quantum Information, vol. 1, 2017, pp. 1-8.
Kehayias, et al., "Solution Nuclear Magnetic Resonance Spectroscopy on a Nanostructured Diamond Chip", Nature Communications, vol. 8, No. 188, 2017.
Choy, et al., "Spontaneous Emission and Collection Efficiency Enhancement of Singe Emitters in Diamond via Plasmonic Cavities and Gratings", Applied Physics Letters, 2013, pp. 1-19.
Hadden, et al., "Strongly Enhanced Photon Collection from Diamond Defect Centers Under Microfabricated Integrated Solid Immersion Lenses", Applied Physics Letters, vol. 97, No. 241901, 2010, pp. 1-3.
Zhang, et al., "Surface Coating with Oxide Layers to Enhance the Spin Properties of Shallow NV Centers in Diamond", 2019, pp. 1-6.
International Search Report from corresponding PCT Appln. No. PCT/EP2021/060736 dated Feb. 7, 2021.

* cited by examiner

PARALLELIZED MAGNETIC SENSING OF SAMPLES USING SOLIDSTATE SPIN SYSTEMS

FIELD OF THE INVENTION

The present invention is in the field of chemical analysis and medical diagnostics. In particular, the invention relates to a sensor chip for parallelized magnetic sensing of a plurality of samples using optically addressable solid-state spin systems.

BACKGROUND

High-throughput parallelized analysis of samples is essential for many applications in chemistry, life sciences, and medicine. Such experiments may for example be conducted on microfluidic chips comprising a plurality of microfluidic sample wells, in which a large number of samples may be provided and processed simultaneously. Due to the small sample volumes involved, however, these experiments are so far limited to highly sensitive detection techniques such as fluorescence spectroscopy or mass spectrometry.

Nuclear magnetic resonance (NMR) spectroscopy may allow for resolving structures on the molecular level and molecular dynamics as well as for a quantitative, non-destructive analysis of samples. Yet, in contrast to the aforementioned methods, NMR spectroscopy typically requires larger samples and expensive devices, which has so far prevented the parallelized analysis of samples on a large scale.

In recent years, rapid progress has been made in using quantum technologies for various sensing applications. A prominent example thereof are nitrogen-vacancy (NV) centers in diamond, see e.g. R. Schirhagl et al., *Annu. Rev. Phys. Chem.* 65, 83-105 (2014) and A. Boretti et al., *Beilstein J. Nanotechnol.* 10, 2128-2151 (2019). These point-like defects constitute a versatile quantum system exhibiting an atom-like energy spectrum with electronic and spin degrees of freedom, which react to external electric and magnetic fields and can moreover be manipulated with light and microwaves. NV centers can thus for example be used as nanoscale magnetometers with optical read-out for detecting magnetic fields. This e.g. allows for performing NMR spectroscopy on picoliter volumes, e.g. as reported in D. R. Glenn et al., *Nature* 555, 351-354 (2018) and WO 2018/052497 A2, and for recording single-shot magnetic resonance spectra as e.g. described in WO 2018/128543 A1.

This approach could in principle be extended to a plurality of samples, e.g. using an array of selectively addressable sites each of which comprises an ensemble of NV centers similar to the one described in H. Zhang et al., *npj Quantum Inf.* 3:31 (2017). However, the laser power required for simultaneously exciting NV centers at multiple sites prevents parallel measurements at more than a handful of sites due to limitations in the output power of avail-able laser sources, the risk of damaging samples and optical elements at high light intensities as well as the high cost and expensive optics associated with high laser powers.

SUMMARY OF THE INVENTION

The object of the invention is thus to enable high-throughput magnetic sensing of a plurality of samples using nitrogen-vacancy centers while avoiding excessive laser power de-mand and preventing damage to the samples.

This object is met by a sensor chip for parallelized magnetic sensing of a plurality of samples, a system for parallelized magnetic sensing of a plurality of samples, and a method for probing a plurality of samples using optically addressable solid-state spin systems. Embodiments of the present invention are detailed in the dependent claims.

The sensor chip for parallelized magnetic sensing of a plurality of samples according to the invention comprises an optically transparent substrate. A plurality of optically addressable solid-state spin systems is arranged in a plurality of sensing regions in a surface layer below a top surface of the substrate. The sensor chip further comprises a plurality of sample sites. Each sample site is arranged above a respective sensing region. In addition, the sensor chip comprises a light guiding system that is configured to provide an optical path through the substrate, wherein the optical path connects each of the sensing regions.

The solid-state spin systems are quantum systems with a spin degree of freedom that are arranged or embedded in a solid host material, wherein the spin degree of freedom can be read out and/or manipulated via optical transitions. The spin systems may in particular be objects that behave like artificial atoms or molecules, i.e. systems that exhibit an atom- or molecule-like energy spectrum and have at least two different spin states. The spin systems may for example be optically active defects in a crystal structure. Energy levels of different spin states may shift in the presence of a magnetic field. Furthermore, a spin system may for example have a spin-state dependent transition rate between different states of the spin system, e.g. electronic states of the spin system. The solid-state spin systems may thus be used as a probe for a magnetic field, e.g. by determining an energy difference and/or a transition rate between states of the spin systems.

The solid-state spin systems are arranged in the sensing regions located in the surface layer underneath the substrate's top surface. The surface layer may for example have a thickness perpendicular to the top surface between 2 µm and 1000 µm, in one example between 10 µm and 100 µm. In some examples, the surface layer may form the top surface of the substrate at least in part. In other examples, one or more additional layers may be arranged between the surface layer and the top surface, e.g. an optical coating and/or a well layer as detailed below. In some examples, the spin systems may be confined to the sensing regions, whereas in other examples, the spin systems may be distributed over the entire surface layer, e.g. as detailed below. In one example, the sensing regions may extend through the entire substrate perpendicular to the top surface, i.e. the depth of the sensing regions/surface layer perpendicular to the top surface may be equal to the thickness of the substrate.

At least a part of the substrate is optically transparent, in particular at wavelengths associated with one or more transitions of the spin systems, e.g. at an absorption wavelength associated with an excitation from a stable or meta-stable state of the spin systems and/or at an emission wavelength associated with a decay from a meta-stable or short-lived state of the spin systems. In some examples, the substrate may be transparent at least throughout the visible and/or near-infrared spectrum, e.g. between 400 nm and 1600 nm.

Each of the sample sites is arranged above one of the sensing regions. The sample sites may for example be microfluidic sample wells and may for example be configured to receive a liquid and/or solid sample, e.g. a microdroplet of a sample fluid. The sample fluid may e.g. comprise one or more substances dissolved therein. Additionally or alternatively, the sample sites may for example be hydrophilic areas, e.g. areas on a surface of the sensor chip and/or of the substrate with a hydrophilic coating. Preferably, areas adjacent to the sample sites are hydrophobic and may for example comprise a hydrophobic coating, e.g. to confine a microdroplet of the sample fluid to the hydrophilic sample site. In some examples, a size of the sample sites in a plane parallel to the top surface may be adapted to a size of the sensing regions, e.g. such that side walls of a sample well are aligned with boundaries of the respective sensing region. Each of the sample sites may for example have a width or diameter parallel to the top surface between 2 µm and 500 µm. The sample wells may e.g. enclose a volume between 1 picoliter and 1 microliter. In some embodiments, two or more of the sample wells may be connected to each other and/or the sample wells may be connected to or be part of a microfluidic system, e.g. to provide and/or to remove a sample fluid from the sample wells. In a preferred embodiment, the sample sites and the sensing regions are arranged in a regular pattern, e.g. in a periodic one-dimensional or two-dimensional array with a constant intersite spacing, e.g. as detailed below.

The light guiding system is configured to provide an optical path between the sensing regions such that light propagating along the optical path sequentially passes through each of the sensing regions at least once. In other words, all of the sensing regions are arranged along the optical path provided by the light guiding system. The light guiding system may in particular be configured to provide the optical path between the sensing regions for light at one or more absorption wavelengths of the spin systems. Preferably, light propagating along the optical path passes through each sensing region the same number of times, e.g. once. In some examples, a part of the optical path may lie outside of the substrate. The light guiding system may in particular comprise one or more optical elements that modify the propagation of light along the optical path such as a reflecting structure, an optical coating, and/or a waveguide.

In some embodiments, at least two segments of the optical path are not parallel to each other, e.g. due to a reflection off a reflecting element of the light guiding system or due to a curved or bend portion of a waveguiding element of the light guiding system. Each of the non-parallel segments may in particular be arranged or extend between two or more of the sensing regions. The non-parallel segments may be within the substrate or may lie outside of the substrate at least in part. In some examples, the optical path may additionally comprise one or more sets of parallel segments. The optical path may for example form a periodic pattern, e.g. a zig-zag pattern and/or a meandering pattern, in one or more planes, e.g. in a plane perpendicular or parallel to the top surface of the substrate. In some examples, the optical path may form a non-intersecting pattern, in particular a non-intersecting periodic pattern.

By providing an optical path connecting each of the sensing regions, light for addressing the spin systems can be re-used for multiple sensing regions, thereby allowing for the manipulation of and measurements on a large number of samples without requiring excessive amounts of optical power. For example, a laser pulse for exciting the spin systems may be coupled into the optical path and may sequentially pass through each of the sensing regions. Typically, the fraction of light absorbed by spin systems in a given sensing region is negligible and a similar excitation probability may thus be achieved in all sensing regions. Furthermore, the light guiding system may be configured so as to minimize an overlap of the laser pulse with samples arranged on the sample sites, thereby reducing the risk of damaging or otherwise interfering with the samples. In addition, the optical path provided by the light guiding system may be designed such that illumination of the sensing regions does not interfere with the detection of optical signals from the sensing regions and vice versa, e.g. as detailed below.

The light guiding system comprises one or more optical elements. In some embodiments, the light guiding system may for example comprise one or more reflective coatings. The reflective coatings may for example be arranged on the top surface of the substrate, on a bottom surface of the substrate opposing the top surface and/or on one or more side faces of the substrate extending between the top and bottom surfaces. The reflective coatings may in particular be reflective at one or more absorption wavelengths of the solid-state spin systems. The reflective coatings may for example extend over the entire respective surface of the substrate or a part thereof. Additionally or alternatively, the reflective coatings may be arranged in specific regions on a surface of the substrate, e.g. above the sensing regions on the top surface. Preferably, the optical path is confined to the volume between the top and bottom surfaces of the substrate or at least to the volume between the planes containing the top and bottom surfaces. In some examples, the reflective coating on the top surface may have a magnetic susceptibility that lies between a magnetic susceptibility of the substrate and a magnetic susceptibility of the sample. The reflective coating may in particular have a magnetic susceptibility between the magnetic susceptibility of diamond and the magnetic susceptibility of water.

In some embodiments, the propagation of light along the optical path may also comprise one or more total internal reflections at a surface of the substrate, i.e. the light guiding system may be configured such that an angle of incidence of the optical path on the respective surface is larger than the critical angle for total internal reflection. Additionally or alternatively, the light guiding system may also comprise one or more reflective elements arranged outside of the substrate, e.g. a micromirror attached to a frame of the sensor chip that the substrate is mounted in. In some examples, the reflective elements outside of the substrate may be adjustable and may e.g. be tiltable around one or two axes.

Illumination schemes for solid-state spin systems involving optical paths with multiple reflections have already been used in other contexts, for example for separating the illumination and detection paths for probing a single sample with an ensemble of NV centers as reported in D. R. Glenn et al., *Nature* 555, 351-354 (2018) and WO 2018/052497 A2. Furthermore, such "folded" paths may also allow for homogeneously illuminating bulk diamond substrates, see e.g. US 2019/0145919 A1 and L. Bougas et al., *Micromachines* 9, 276 (2018).

In a preferred embodiment, the light guiding system comprises a dichroic reflective coating and/or a broadband reflective coating. The dichroic reflective coating is configured to reflect light at an absorption wavelength of the solid-state spin systems and to transmit light at an emission wavelength of the solid-state spin systems. The broadband reflective coating is configured to reflect light at the absorption wavelength and at the emission wavelength of the solid-state spin systems. Preferably, the dichroic reflective coating is arranged on the bottom surface of the substrate, whereas the broadband reflective coating is arranged on the top surface of the substrate. In this way, light at the absorption wavelength propagating along the optical path may e.g.

be reflected off the bottom and top surfaces of the substrate, which may for example reduce the amount of light that leaks into samples on the sample sites through the top surface and into a detection path through the bottom surface. Light emitted by the spin systems in the sensing regions at the emission wavelength may be detected through the bottom surface, while being reflected off the top surface, thereby enhancing the amount of light that can be collected for detection.

In some embodiments, the light guiding system comprises one or more retroreflecting structures, each of which comprises two or more angled surfaces configured to retroreflect a light beam propagating through the substrate along the optical path. The retroreflecting structures may in particular be arranged on or formed by a side face of the substrate or may be arranged adjacent to a side face of the substrate, e.g. on a frame of the sensor chip. The light guiding system may for example comprise retroreflecting structures on or adjacent to two opposing side faces of the substrate. In one example, a retroreflecting structure comprises two mutually orthogonal surfaces configured to retroreflect an incident beam with a displacement relative to the incident beam. The orthogonal surfaces may e.g. form an angle of +45° and −45°, respectively, with a normal vector of a side face of the substrate. In some examples, one or both of the angled surfaces may be coated with a reflective coating, e.g. as described above. In other examples, the orientation of one or both of the angled surfaces relative to the optical path may be such that light is reflected by total internal reflection.

In a preferred embodiment, the light guiding system comprises one or more focusing elements configured to refocus a light beam propagating along the optical path. The focusing elements may in particular be arranged between sensing regions along the optical path, i.e. such that light propagating between the sensing regions along the optical path passes through or is reflected off the focusing elements. A focusing element may for example comprise a lens or a curved surface that the light beam is reflected off, e.g. a curved surface on a surface of the substrate. In one example, one or both of the angled surfaces of a retroreflecting structure may be curved. In some examples, some or all of the focusing elements may also be arranged outside of the substrate and may e.g. be a microlens or a curved micromirror attached to a frame of the sensor chip that the substrate is mounted in. Using focusing elements may allow for maintaining an approximately constant beam diameter along the optical path. In one example, the one or more focusing elements may be configured such that a beam diameter at the various sensing regions varies by less than 50%, preferably by less than 20%.

In some embodiments, the light guiding system comprises a waveguide that is configured to guide a light beam along the optical path or a part thereof, in particular a waveguide in the substrate. The waveguide may for example be configured to confine light to one or more optical modes extending along the optical path or a part thereof. Preferably, the waveguide is a multi-mode waveguide carrying a large number of optical modes. The light guiding system may for example comprise a one-dimensional waveguide configured to confine light propagating along the optical path in one direction, e.g. perpendicular to the top surface of the substrate. In one example, a thickness and/or refractive index of the substrate may be chosen such that the top and bottom surfaces of the substrate and/or a cladding layer arranged thereon form a one-dimensional planar waveguide. For this, the thickness of the substrate may for example be between 10 µm and 30 µm. Additionally or alternatively, the substrate may comprise one or more reflective coatings to form the waveguide. Light propagating along the optical path may propagate in many modes of the waveguide simultaneously, e.g. through an "infinite" number of reflections off the bottom and top surfaces of the substrate.

In some embodiments, the light guiding system comprises a two-dimensional waveguide configured to confine light propagating along the optical path in two orthogonal directions, wherein the waveguide may form at least a part of the optical path. Preferably, the sensing regions are formed in the waveguide, e.g. at regular intervals along the waveguide. The waveguide may be formed in the substrate, e.g. by an appropriate structuring of the bottom and/or top surface of the substrate. In some examples, the substrate may be a composite substrate comprising a carrier material that the waveguide is arranged or embedded in. The waveguide may comprise at least one bent portion and may e.g. extend along a meandering path comprising a plurality of parallel segments connected by bent portions. In one example, the light guiding system may comprise a plurality of two-dimensional waveguides that extend parallel to each other.

In a preferred embodiment, the sensor chip further comprises a plurality of solid immersion lenses, wherein the solid immersion lenses may e.g. be arranged on the bottom surface of the substrate. Preferably, each of the solid immersion lenses is arranged below a respective one of the sensing regions, e.g. to collect light emitted by spin systems in the respective sensing region. In some embodiments, light propagating along the optical path may be reflected off the surface that the solid immersion lenses are arranged on and the solid immersion lenses may be arranged between the reflection points such that the solid immersion lenses do not cover the reflection points. The solid immersion lenses may consist of or comprise a material with the same refractive index or a higher refractive index than the substrate and may e.g. be hemispherical or Weierstrass solid immersion lenses. In some embodiments, the solid immersion lenses are formed by the bottom surface of the substrate, which may e.g. have been structured accordingly. Guiding light along the optical path through the substrate with the light guiding system may allow for using solid immersion lenses to increase the collection efficiency of an imaging system for detection of optical signals from the sensing regions without interfering with the illumination of the sensing regions. This may in particular be advantageous for substrates comprising high refractive index materials such as diamond, for which the collection efficiency may be limited due to the small critical angle for total internal reflection.

In some embodiments, the sample sites may be microfluidic sample wells. One or more walls of each sample well may be formed by the substrate, in particular the bottom wall of each sample well. This may be advantageous to minimize the distance between a sample placed in a sample well and the respective sensing region to facilitate interaction with the spin systems. In some examples, the sample wells may be formed entirely in the top surface of the substrate, i.e. may be depressions or cut-outs in the top surface. In other examples, the sample wells may be formed in a well layer arranged on the top surface of the substrate. The well layer may be removed completely above the sensing regions, e.g. such that the top surface of the substrate forms the bottom walls of the sample wells and the well layer forms the side walls of the sample wells. In other examples, the well layer may be removed partially above the sensing regions, e.g. such that a thin well layer forming the bottom walls of the sample wells remains on the top surface of the substrate. The thin well layer may for example protect the samples from evanescent light leaking out of the substrate and may e.g. have a thickness between 0.1 μm and 1 μm. In some examples, the well layer may comprise an opaque material, which may e.g. facilitate the separation of light emitted by adjacent sensing regions when imaging through the top surface. Preferably, the well layer comprises a material having a magnetic susceptibility adapted to the magnetic susceptibility of the samples, e.g. a magnetic susceptibility that lies between the magnetic susceptibility of the substrate and the magnetic susceptibility of the sample. The well layer may in particular have a magnetic susceptibility between the magnetic susceptibility of diamond and the magnetic susceptibility of water.

In a preferred embodiment, the sensing regions are arranged in a two-dimensional array in the surface layer of the substrate. The array may for example be a periodic array and the sensing regions may e.g. form a rectangular or quadratic grid with constant spacing. In other examples, the array may be aperiodic.

Preferably, a distance between adjacent sensing regions and/or sample sites, respectively, is at least two times, in one example at least five times as large as a width or diameter of the sensing regions and/or of the sample sites, respectively, in a plane parallel to the top surface. In one example, the intersite distance is between 2 and 20 times as large as the width of the sample sites. The width of the sensing regions may e.g. be the same as the width of the sample sites and may for example be between 2 μm and 500 μm. In one example, the width of the sensing regions and/or of the sample sites is the same as the thickness of the surface layer.

In some embodiments, the solid-state spin systems are arranged throughout the entire surface layer of the substrate. In some examples, a density of the spin systems may be homogenous throughout the surface layer. In other examples, the density of the spin systems may be homogenous within planes parallel to the top surface in the surface layer, but may vary as a function of the depth from the top surface. In one example, the substrate may have been grown by chemical vapor deposition (CVD), e.g. of carbon, and the surface layer may have been formed by adding one or more additional substances to the CVD gas mix, e.g. nitrogen.

In other embodiments, the solid-state spin systems may be confined to a part of the surface layer, in particular to the sensing regions. In some examples, a density of the solid-state spin systems in the substrate outside of the sensing regions is at least a factor of 100, preferably at least a factor of 1000 smaller than a density of the solid-state spin systems within the sensing regions.

In embodiments, in which the spin systems are arranged throughout the entire surface layer, the sensing regions may be regions around intersections between the optical path and the surface layer, i.e. regions in which spin systems may be excited by light propagating along the optical path. Accordingly, the optical path does not intersect with the surface layer outside of the sensing regions. Light propagating along the optical path may e.g. be reflected off the top surface of the substrate below each of the sample sites, thereby defining the corresponding sensing regions. The size of the sensing regions may be determined by a pre-defined beam profile, e.g. a pre-defined beam diameter, which may for example be between 10 μm and 100 μm.

In embodiments, in which the spin systems are confined to the sensing regions, the optical path may have a similar shape and may for example not intersect with the surface layer outside of the sensing regions, e.g. due to reflections off the substrate's top surface below the sample sites. In other examples, the optical path or at least a part thereof may extend parallel to the top surface or at a small angle relative to the top surface, e.g. at an angle of less than 5°, in one example an angle of less than 2°. The optical path or a part thereof may in particular extend within the surface layer between the sensing regions, e.g. at a constant depth below the top surface, which may for example correspond to half the thickness of the surface layer, i.e. such that the optical path extends in a center plane of the surface layer at least in part.

In a preferred embodiment, the substrate comprises or consists of diamond and the solid-state spin systems are diamond color centers, i.e. optically active point defects in the diamond crystal structure. Preferably, the spin systems are nitrogen-vacancy (NV) centers in diamond, in particular negatively charged nitrogen-vacancy centers.

In some embodiments, the sensing regions may form a first set of sensing regions and the substrate may comprise at least a second set of sensing regions in the surface layer below the top surface. The light guiding system may be configured to provide a first optical path through the substrate connecting each of the sensing regions in the first set and a second optical path through the substrate connecting each of the sensing regions in the second set. At least one of the first and second optical paths may comprise two non-parallel segments in some embodiments. In some examples, the light guiding system may comprise a beam splitter that splits an ingoing optical path into the first and second optical paths, e.g. a polarizing or non-polarizing beam splitter. In one example, the substrate comprises a plurality of sets of sensing regions in the surface layer below the top surface and the light guiding system is configured to provide a respective optical path through the substrate for each of the sets, wherein the optical path connects each of the sensing regions in the respective set.

The invention further provides a system for parallelized magnetic sensing of a plurality of samples using a sensor chip, wherein the sensor chip comprises an optically transparent substrate with a plurality of optically addressable solid-state spin systems arranged in a plurality of sensing regions in a surface layer below a top surface of the substrate. The system according to the invention comprises an illumination system and a mount configured to receive the sensor chip. The illumination system is configured to couple a laser beam generated by a laser source into an optical illumination path through the substrate to excite solid-state spin systems in the sensing regions, wherein the illumination path sequentially intersects with each of the sensing regions.

The mount may in particular be configured to receive a sensor chip according to the invention as described above, wherein the illumination path may be the optical path provided by the light guiding system of the sensor chip. Accordingly, the illumination system may be configured to couple an incoming laser beam into the sensor chip's optical path, e.g. through an entrance facet or port, which may e.g. be arranged on a side face of the substrate. The mount may be configured to hold and/or adjust the sensor chip such that the entrance facet of the substrate is aligned with an output port of the illumination system.

Additionally or alternatively, the mount may also be configured to receive other sensor chips, e.g. a sensor chip without a light guiding system. Such a sensor chip may for example comprise a slab-like substrate without any reflective coatings, retroreflecting structures and/or waveguides. The illumination system may e.g. be configured to couple the laser beam into the substrate such that the laser beam undergoes total internal reflection at the top surface, at the bottom surface and/or at side faces of the substrate, thereby sequentially illuminating each of the sensing regions. In other examples, the illumination system may be configured to couple the laser beam into the substrate such that the laser beam propagates along a straight line parallel to a surface of the substrate, e.g. parallel to the top surface. On the top surface of the substrate, a plurality of samples may be arranged adjacent to the sensing regions, e.g. on a plurality of sample sites above the sensing regions as described above.

The illumination system may for example comprise an alignment subsystem with one or more adjustable optical elements, in particular adjustable mirrors, for coupling the laser beam into the illumination path. In some embodiments, the illumination system may further comprise a beam shaper configured to adjust a beam diameter, an intensity profile, a phase pattern, a pulse energy and/or a pulse length of the incoming laser beam, e.g. as detailed below.

In a preferred embodiment, the illumination path comprises at least two segments that are not parallel to each other, e.g. as described above for the sensor chip according to the invention. In particular, light propagating along the illumination path may for example be sequentially reflected off the top surface of the substrate in the vicinity of each of the sensing regions, i.e. such that the laser beam propagates through the sensing regions one after the other. The laser beam may e.g. be reflected off the top surface below sample sites such as sample wells on the top surface. In another example, the illumination path may comprise a single reflection off the top surface, e.g. at the center of the top surface. The two non-parallel segments of the illumination path connected by the single reflection may extend at a small angle relative to the top surface such that the illumination path passes through each of the sensing regions. The angle relative to the top surface may for example be between 0° and 5°, in one example between 0° and 2°. Additionally or alternatively, the laser beam propagating along the illumination path may also be reflected off the bottom surface of the substrate and/or off surfaces that are perpendicular to the top surface of the substrate and/or or parallel to side faces of the substrate. In some examples, the laser beam may be reflected off the respective surfaces sequentially. The laser beam may in particular be reflected off side faces of the substrate, which may for example be perpendicular to the top surface or at an angle between 85° and 95° to the top surface. Additionally or alternatively, the laser beam propagating along the illumination path may also be reflected off reflective elements arranged outside of the substrate and/or outside of the sensor chip. In some examples, the reflective elements outside of the substrate may be adjustable, e.g. tiltable around one or two axes. In some embodiments, at least one, in one example all of the reflections along the illumination path occur by total internal reflection at one or more surface of the substrate. Additionally or alternatively, surfaces of the substrate may comprise reflective coatings, e.g. as described above. Preferably, the illumination path is confined to the volume between the top and bottom surfaces of the substrate or to the volume between the planes containing the top and bottom surfaces.

In some embodiments, the illumination system is configured to couple the laser beam into a waveguide in the substrate forming at least a part of the illumination path, e.g. as described above. For this, the illumination system may for example comprise a focusing element such as a lens to focus the incoming laser beam onto an input facet of the waveguide. The waveguide may in particular be a one-dimensional planar waveguide formed by the top and bottom surfaces of the substrate or a two-dimensional waveguide formed in the substrate. Preferably, the waveguide is a multi-mode waveguide carrying a large number of optical modes and light propagating along the illumination path may propagate in many modes of the waveguide simultaneously, e.g. through an "infinite" number of reflections off the bottom and top surface of the substrate. The thickness of the substrate may for example be between 10 µm and 30 µm and may be similar to a diameter of the laser beam at the input facet.

In some embodiments, the illumination path may form a periodic and/or non-intersecting pattern, for example in a plane parallel to the top surface of the substrate, e.g. as described above. The illumination path may in particular comprise one or more sets of parallel segments and may for example form a zig-zag pattern and/or a meandering pattern.

In a preferred embodiment, the illumination system comprises one or more focusing elements such as lenses and/or curved reflective surfaces along the illumination path configured to refocus the laser beam propagating along the illumination path. The illumination system may for example be configured to maintain a diameter of the laser beam along the illumination path. The focusing elements may in particular be arranged between sensing regions along the illumination path. In some embodiments, the focusing element may be arranged outside of the substrate and/or of the sensor chip, e.g. on the mount for the sensor chip. Additionally or alternatively, focusing elements may be part of the sensor chip and may e.g. be formed by or arranged on side faces of the substrate as detailed above.

In some embodiments, the illumination system comprises a beam shaper configured to adjust a beam diameter, an intensity profile, a phase pattern, a pulse energy and/or a pulse length of the incoming laser beam. The beam shaper may in particular be configured to convert the laser beam, which may e.g. be a Gaussian beam, to a Bessel beam, i.e. a beam with an intensity profile corresponding to the square of a Bessel function of the first kind. This may allow for maintaining the diameter of the laser beam along the illumination path due to the non-diffractive propagation of Bessel beams. For this, the illumination system may for example comprise a reflective or refractive axicon.

In some embodiments, the sensing regions may form a first set of sensing regions and the sensor chip may comprise at least a second set of sensing regions, in some examples a plurality of sets of sensing regions. The illumination system may be configured to couple a laser beam into a respective illumination path for each of the sets of sensing regions, wherein the illumination path sequentially intersects with each of the sensing regions of the respective set. The laser beams may be generated by different laser sources or by the same laser source. In a preferred embodiment, the illumination system comprises a beam splitter, wherein the beam splitter may e.g. be configured to couple a laser beam generated by a laser source into a first illumination path sequentially intersecting with each of the sensing regions in the first set and into a second illumination path sequentially intersecting with each of the sensing regions in the second set. In one example, the illumination system comprises a plurality of beam splitters for coupling the laser beam generated by the laser source into a plurality of illumination paths. Preferably, the beam splitters are configured to equally split the laser beam between the illumination paths, i.e. such that the optical power is the same in each of the illumination paths.

In a preferred embodiment, the system further comprises an imaging system that is configured to collect light emitted by solid-state spin systems in the sensing regions. The imaging system may for example comprise an objective that is configured to image light emitted from the sensing regions onto a detector, e.g. through the top surface or preferably through the bottom surface of the substrate. Additionally or alternatively, the imaging system may comprise detection light guides or waveguides that are arranged adjacent to or in contact with the substrate to collect the emitted light, e.g. one detection light guide underneath each sensing region. Each of detection light guides may for example comprise a fiber bundle or a large-diameter multi-mode fiber, e.g. a multi-mode fiber having a core diameter larger than 200 μm. In some examples, the detection light guides may be part of the sensor chip and the illumination system may be configured to collect light emitted from the detection light guides.

Preferably, the imaging system is configured to simultaneously determine an intensity of the emitted light for each of the sensing regions. The illumination system may for example comprise a detector such as a multi-channel photodetector having an independent channel for each of the sensing regions. The multi-channel photodetector may for example comprise a plurality of photodiodes, e.g. an array of photodiodes, and/or an extended photodetector with a plurality of detection regions that can be read out independently, e.g. a CCD or CMOS camera. In one example, the multi-channel photodetector may be a lock-in camera configured to determine differential signals by subtracting signals of two subsequent measurement, preferably prior to analog-to-digital conversion of the signals. Preferably, the imaging system is configured to be synchronized with one or more other elements of the system or devices connected to the system, e.g. a laser source and/or a microwave generator. The detector may for example be configured to receive a trigger signal to initiate the determination of the emitted light intensities. In some embodiments, the detector or the imaging system may comprise one or more additional focusing elements, e.g. a respective microlens associated with each channel of a multi-channel photodetector. In one example, the multi-channel photodetector may have more than one channel for each of the sensing regions.

The system according to the invention may further comprise additional elements, e.g. for conducting nuclear magnetic resonance (NMR) spectroscopy. The system may for example comprise a microwave antenna, e.g. a wire antenna, a coil antenna or a horn antenna, or a microwave resonator for applying a microwave signal to the substrate and/or to the plurality of samples. Preferably, the microwave antenna or resonator is configured to apply the microwave signal with a homogeneous amplitude over the entire substrate and/or at each of the samples. The microwave antenna or resonator may be configured to be connected to a microwave generator, which may also be part of the system or may be provided as an independent unit. The microwave generator may in particular be configured to generate a sequence of microwave pulses. Preferably, the system is configured to synchronize the microwave generator with the laser source and the detector, e.g. to apply a sequence of microwave pulses with a pre-defined time delay relative to a laser pulse generated by the laser source and/or relative to a detection interval of the detector. In some examples, the microwave antenna or resonator may also be configured to apply a radio-frequency signal to the substrate and/or to the plurality of samples. In other examples, the system may additionally comprise a radio-frequency antenna or resonator configured to apply a radio-frequency signal to the substrate and/or to the plurality of samples.

The system may further comprise a magnet for applying a bias magnetic field to the substrate and/or to the plurality of samples. Preferably, the magnet is configured to apply a bias magnetic field with a homogeneous field strength over the entire substrate and/or at each of the samples. In some examples, the magnet may be configured to apply a bias magnetic field with an adjustable field strength. The magnet may for example comprise one or more coils configured to be connected to a current source for generating the bias magnetic field, e.g. a pair of Helmholtz coils. In some examples, the magnet and/or the mount for the sensor chip may be configured to adjust an orientation of the magnetic field relative to the substrate, e.g. to align the direction of the magnetic field with a crystallographic axis of the substrate. In one example, the magnet is a permanent magnet, e.g. a rare-earth magnet such as a neodymium (NdFeB) magnet.

In some examples, the system may also comprise a laser source configured to generate a laser beam for the illumination system. In other examples, the laser source may be provided as an independent unit. In some embodiments, the system may further comprise one or more sensor chips, in particular a sensor chip according to one of the embodiments described above.

The invention further provides a method for probing a plurality of samples using optically addressable solid-state spin systems. The method comprises: (1) preparing the samples on a sensor chip comprising an optically transparent substrate, wherein the solid-state spin systems are arranged in a plurality of sensing regions in the substrate and each of the samples is placed adjacent to a respective one of the sensing regions; (2) simultaneously exciting sol-id-state spin systems in each of the sensing regions by illuminating the sensing regions with light propagating along an optical illumination path through the substrate connecting each of the sensing regions; and (3) for each of the sensing regions, detecting an optical signal emitted by solid-state spin systems in the respective sensing region. The above numbering of the steps is for clarity only and does not imply a certain order of execution. As far as technically feasible, the method may be executed in an arbitrary order and steps thereof may be executed simultaneously at least in part.

The method may for example be executed with the system according to the invention and/or with the sensor chip according to one of the embodiments described above. Accordingly, the illumination path may correspond to the illumination path of the system and/or to the optical path of the sensor chip described above. The samples may be solid and/or liquid samples, e.g. microdroplets of a sample fluid. Preparing the samples may comprise arranging the samples on a surface of the substrate, e.g. placing the samples on a top surface above a respective one of the sensing regions, for example on corresponding sample sites, e.g. in corresponding sample wells.

The sensing regions may for example be illuminated by coupling one or more light pulses, in particular laser pulses, into the illumination path such that each light pulse sequentially passes through each of the sensing regions. A wavelength of the light may e.g. be tuned to an absorption wavelength of the spin systems. A diameter of the light pulses may be adjusted to a size of the sensing regions and/or of the samples, e.g. using the illumination system of the system according to the invention. The illumination of the sensing regions along the illumination path may in particular be used to optically polarize the spin systems in the sensing regions and/or to excite the spin systems in the sensing regions to induce the optical signals to be detected, i.e. for optical read-out. An intensity and/or a pulse duration of the light pulses may for example be chosen such that the spin systems are prepared in a pre-defined quantum state. In some examples, the intensity and/or pulse duration may be chosen such that spin systems in the sensing regions undergo multiple transitions, e.g. to increase a fluorescence intensity and/or for optical polarization of the spin systems, i.e. to optically pump the spin systems to a pre-defined state. In other examples, the intensity and/or pulse duration may be chosen such that the excitation probability of the spin systems in the sensing regions reaches a pre-determined value or exceeds a pre-determined threshold, e.g. such that at least 50% or at least 90%, in one example at least 99% of the spin systems are transferred to an excited state. In a preferred embodiment, the sensing regions are illuminated multiple times, e.g. a first time for optical polarization and a second time for inducing the optical signal to be detected. At least one of the illuminations, preferably both of the illuminations occur by light propagating along the illumination path.

For each of the sensing regions, an optical signal is detected that is emitted by spin systems in the respective sensing region. Preferably, the optical signals are detected simultaneously, e.g. using a multi-channel photodetector as described below. The optical signal may for example be the intensity of light emitted by the spin systems at one or more emission wavelengths, e.g. fluorescence emitted by excited spin systems, or may be the intensity of light transmitted through the sensing regions, e.g. to determine an absorption rate of light at one or more absorption wavelengths by the spin systems. The detected signal may for example allow for extracting information pertaining to the state of the spin systems, e.g. an occu-pation probability of one or more spin states, which in turn may for example be used to ex-tract information pertaining to a strength and/or orientation of a magnetic field at the sensing regions, which may e.g. originate from the respective samples at least in part. In some examples, detecting the optical signal comprises exciting spin system in each of the sensing regions by illuminating the sensing regions with light to induce the optical signal to be detected, e.g. in addition to an earlier illumination of the spin systems for optical pumping. In one example, the illumination for inducing the optical signal to be detected may not occur through light propagating along the illumination path. Preferably, the detection is synchronized with the illumination to induce the optical signal, e.g. using corresponding trigger signals for a light source and a detector.

In some embodiments, illuminating the sensing regions comprises reflecting the light propagating along the illumination path at least once along the illumination path, e.g. such that the illumination path comprises at least two non-parallel segments, for example as described above. In some embodiments, this may comprise sequentially reflecting the light propagating along the illumination path off a surface of the substrate in the vicinity of each of the sensing regions, e.g. a top surface of the substrate above the sensing regions. In some examples, light propagating along the illumination path may not intersect with a layer in the substrate that the spin systems are arranged in outside of the sensing regions. In another example, light propagating along the illumination path may be reflected off the top surface a single time, e.g. at the center of the top surface. The two non-parallel segments of the illumination path connected by the single reflection may extend at a small angle relative to the top surface such that the illumination path passes through each of the sensing regions. The angle relative to the top surface may for example be between 0° and 5°, in one example between 0° and 2°. Additionally or alternatively, illuminating the sensing regions may comprise sequentially reflecting the light propagating along the illumination path off surfaces perpendicular to a plane in which the sensing regions are arranged, in particular off side faces of the substrate, and/or reflecting the light off a surface parallel to the plane in which the sensing regions are arranged, in particular off a bottom surface of the substrate. At least some of the reflection may occur by total internal reflection.

In some examples, illuminating the sensing regions may comprise coupling the light into the illumination path through a side face of the substrate, e.g. through an entrance facet or port arranged on the side face. In some examples, illuminating the sensing regions may comprise coupling the light into a waveguide, in particular into a waveguide extending between the sensing regions, for example a waveguide formed in the substrate as described above.

Illuminating the sensing regions preferably also comprises refocusing light propagating along the illumination path between sensing regions, e.g. using focusing elements arranged between the sensing regions as described above. In a preferred embodiment, the diameter of the light beam propagating along the illumination path varies by less than 50%, preferably by less than 20% at the sensing regions.

In some embodiments, the sensing regions form a first set of sensing regions and the sensor chip may comprise at least a second set of sensing regions. Accordingly, the method may also comprise preparing samples on the sensor chip adjacent to respective ones of the sensing regions of the second set, illuminating the sensing regions in the second set and detecting an optical signal from each of the sensing regions in the second set. Illuminating the sensing regions may in particular comprise illuminating the sensing regions in the first set with light propagating along a first illumination path through the substrate connecting each of the sensing regions in the first set and illuminating the sensing regions in the second set with light propagating along a second illumination path through the substrate connecting each of the sensing regions in the second set. In some examples, this may comprise splitting light propagating along an ingoing optical path into light propagating along the first illumination path and light propagating along the second illumination path, e.g. using a beam splitter. The method may furthermore be extended accordingly for sensor chips comprising a plurality of sets of sensing regions.

In a preferred embodiment, the illumination path and the distribution of solid-state spin systems in the substrate are chosen such that a density of excited solid-state spin systems in the sensing regions is at least 100 times, preferably at least 1000 times as large as in adjacent regions of the substrate. In some examples, the spin systems may be confined to the sensing regions, e.g. as described above. The illumination path may for example extend in the plane or layer that the sensing regions are arranged in, e.g. parallel to a surface of the substrate or at a small angle relative to the surface of the substrate, for example at an angle between 0° and 5°. In other examples, the spin systems may be distributed over a layer in the substrate or at least a part thereof, e.g. as described above. The illumination path may not intersect with this layer outside of the sensing regions, thereby ensuring that only spin systems in the sensing regions are excited. In one example, the spin systems are arranged throughout a surface layer below a top surface of the substrate and the light propagating along the illumination path is reflected off the top surface only in the vicinity of the sensing regions.

Preferably, the optical signals are detected along an axis perpendicular to a plane that the sensing regions are arranged in. The sensing regions may for example be arranged in a surface layer below a top surface of the substrate, e.g. as described above. Accordingly, the optical signals may be detected along an axis perpendicular to the top surface, preferably through the bottom surface of the substrate. Preferably, the illumination path is confined to the volume between the top and bottom surfaces of the substrate or to the volume between the planes containing the top and bottom surfaces.

In some embodiments, detecting the optical signals may comprise refracting the light emitted by the spin systems in the sensing regions using solid immersion lenses on a surface of the substrate, e.g. as described above, and/or reflecting the emitted light off a reflective coating on a surface of the substrate, e.g. on a top surface, and transmitting the reflected light through an opposing surface of the substrate.

In a preferred embodiment, detecting the optical signals comprises imaging light emitted from the sensing regions onto a multichannel detector, wherein each channel of the detector is associated with a respective one of the sensing regions. The emitted light may for example be imaged onto the detector using an imaging system with an objective and/or col-lecting the emitted light using a plurality of detection light guides, e.g. as described above. In some examples, more than one channel may be associated with a given sensing region.

The method may further comprise additional steps, for example applying a bias magnetic field, a microwave signal, a radio-frequency (rf) signal and/or light to the sensing regions and/or to the samples. A strength of the bias magnetic field may for example be chosen so as to induce a pre-defined energy splitting between spin states of the spin systems and/or to induce a degeneracy or level crossing between spin states of the spin systems. The microwave and/or radio-frequency signal may for example be applied to prepare the spin systems and/or objects in the samples in a target state, e.g. a well-defined initial state prior to illuminating the sensing regions, and/or to manipulate the state of the spin systems and/or of the objects in the samples. Preferably, the microwave signal, the rf signal, the illumination of the sensing regions and/or the detection of the optical signal are synchronized, i.e. performed at pre-defined time delays relative to each other. In a preferred embodiment, the method comprises (1) optically polarizing the spin systems in the sensing regions, in particular through illumination of the sensing regions along the illumination path as described above, (2) manipulating the spin systems by applying microwave and/or rf signals, and (3) optically exciting the spin systems for inducing the optical signals to be detected, in particular through illumination of the sensing regions along the illumination path as described above. The method may in particular comprise performing an NMR spectroscopy sequence by applying a plurality of microwave, rf and/or optical pulses, wherein the illumination of the sensing regions along the illumination path serves as a pumping pulse for optical polarization of the spins systems and/or as an optical read-out pulse for determining information pertaining to the state of the spin systems in the sensing regions via the detected optical signals.

LIST OF FIGURES

Figure 2A:
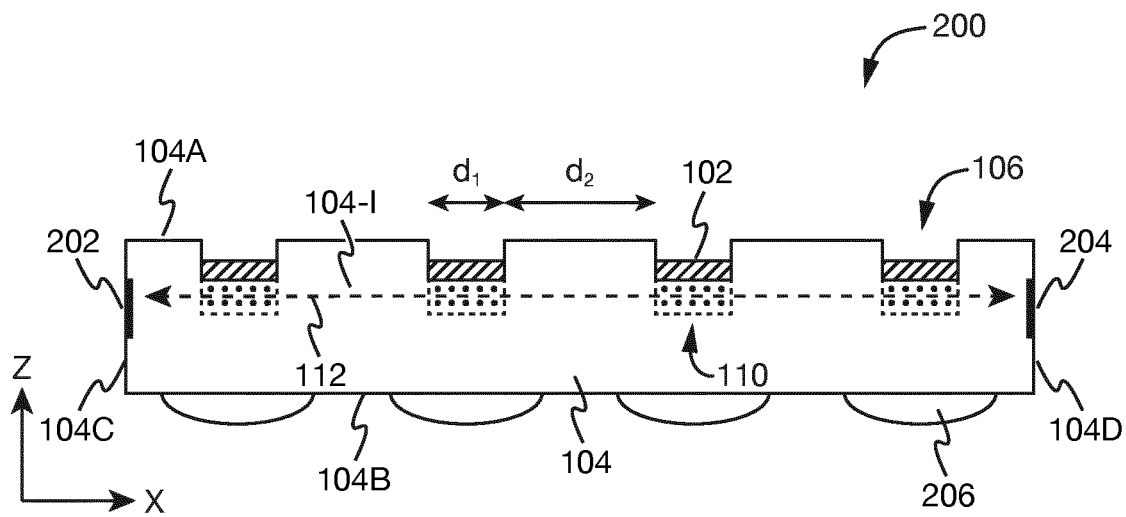
Figure 2B:
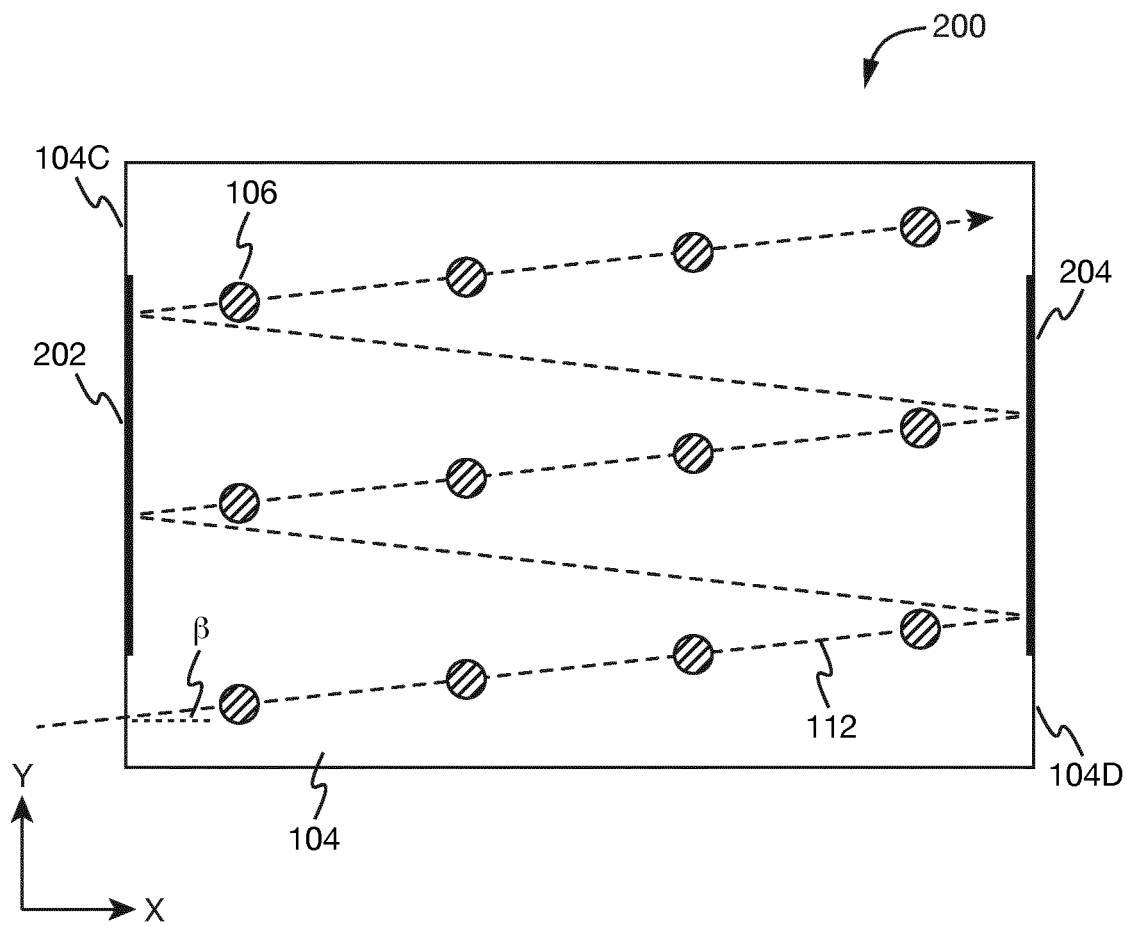
Figure 3:
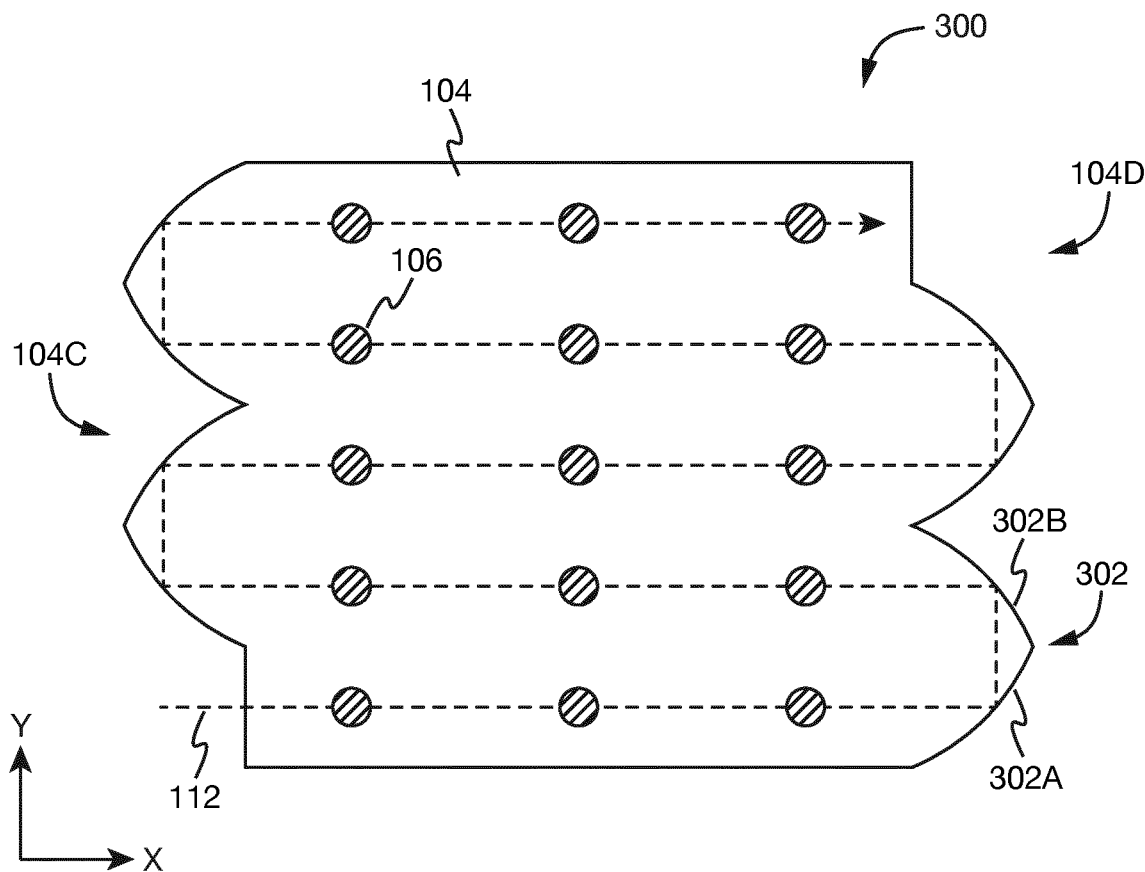
Figure 4:
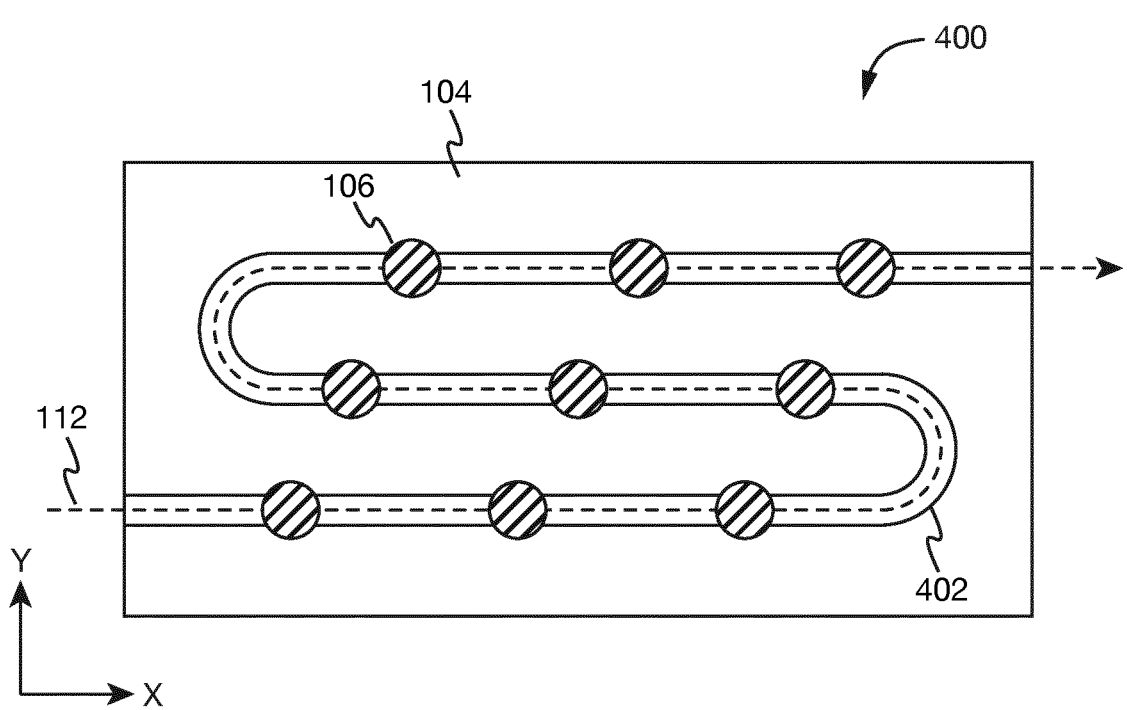
Figure 5:
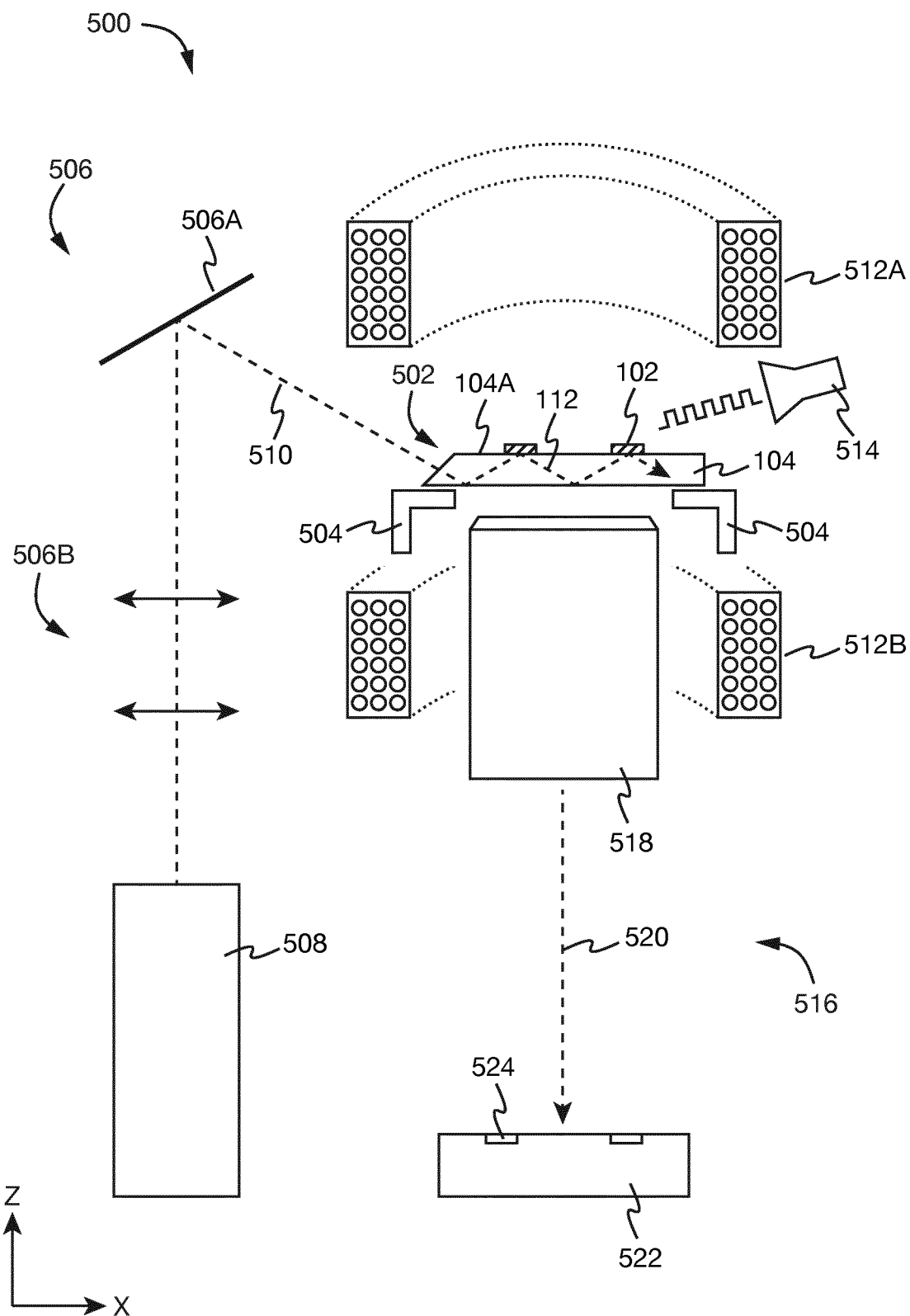
Figure 6:
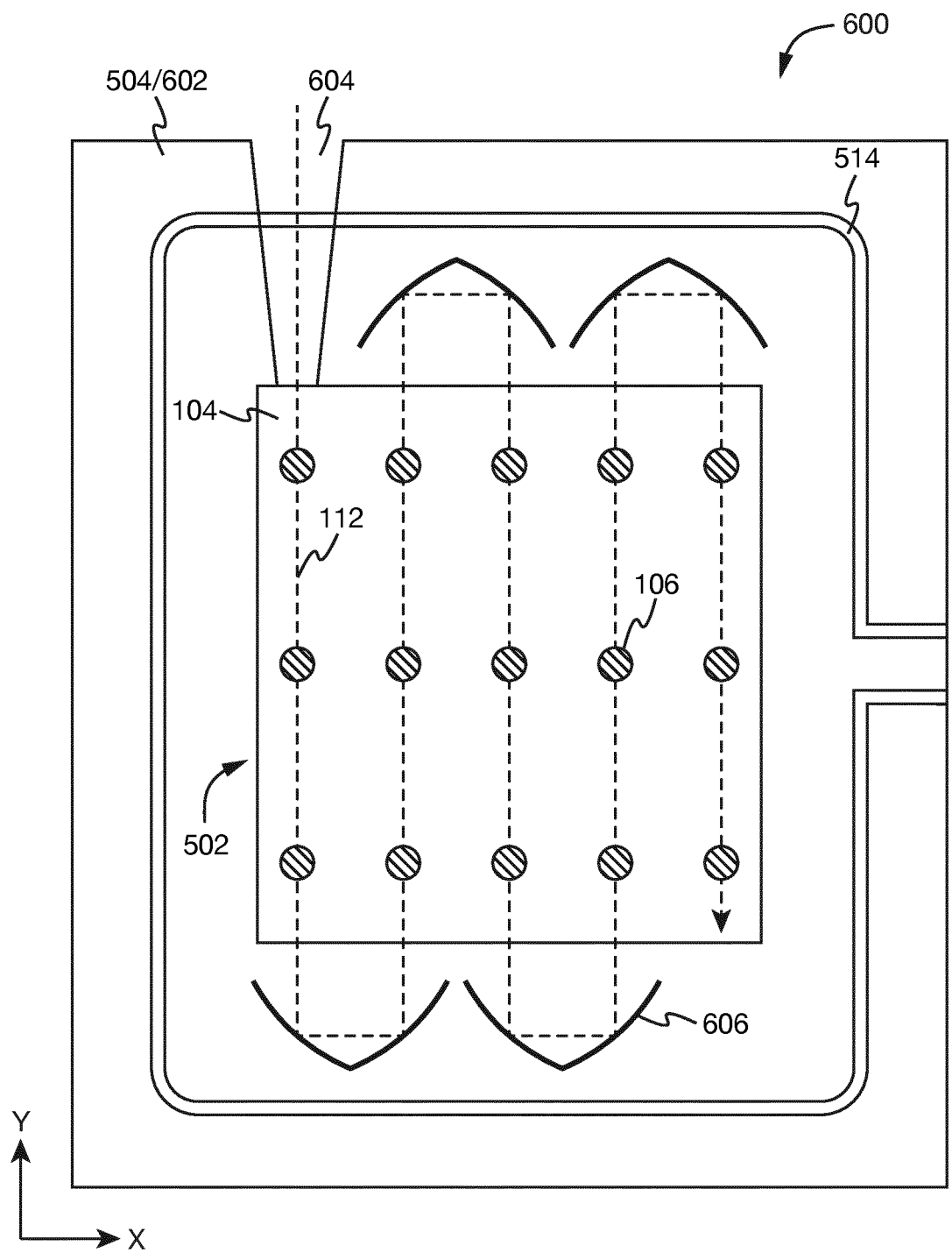
Figure 7:
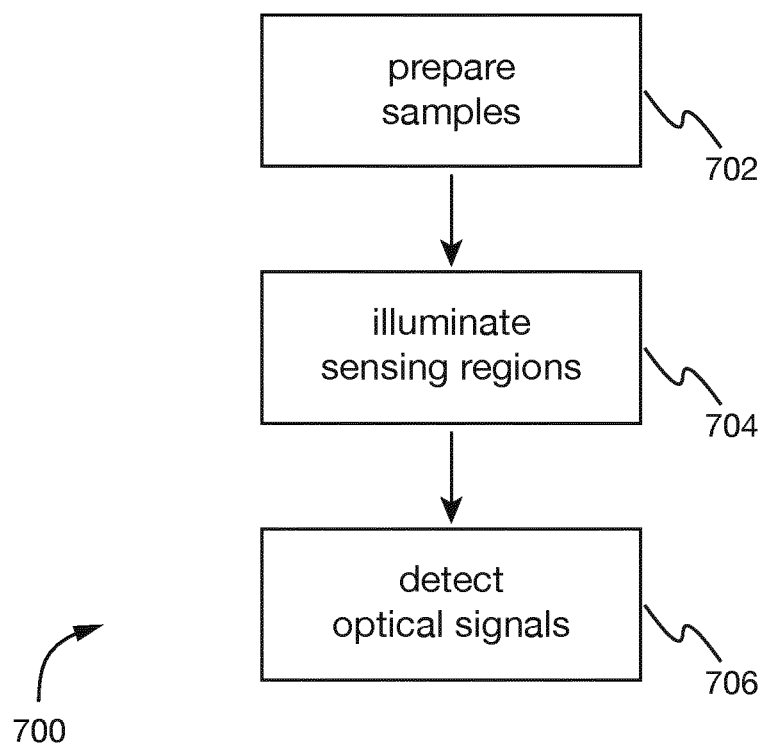
Figure 8:
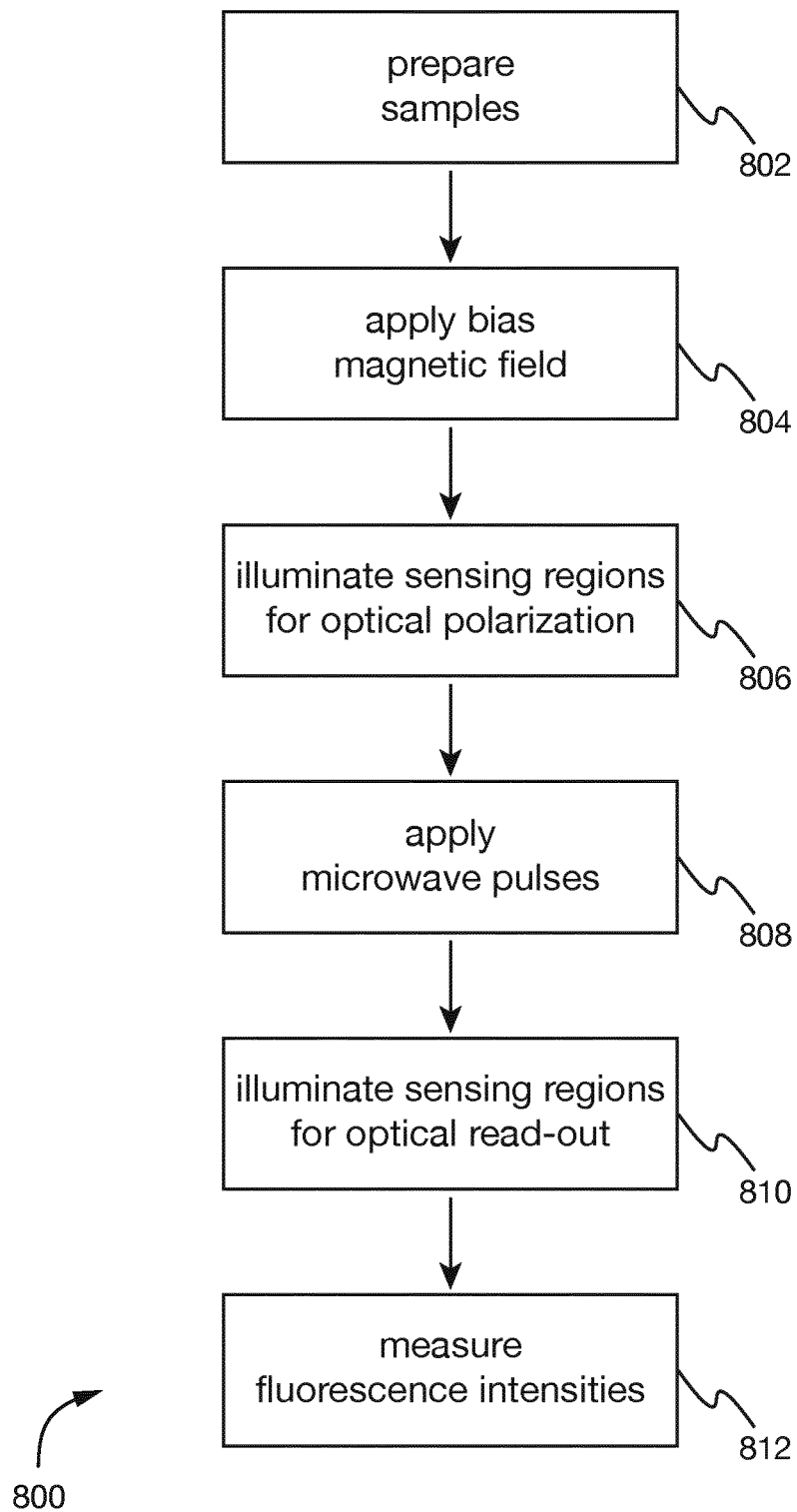
Figure 9A:
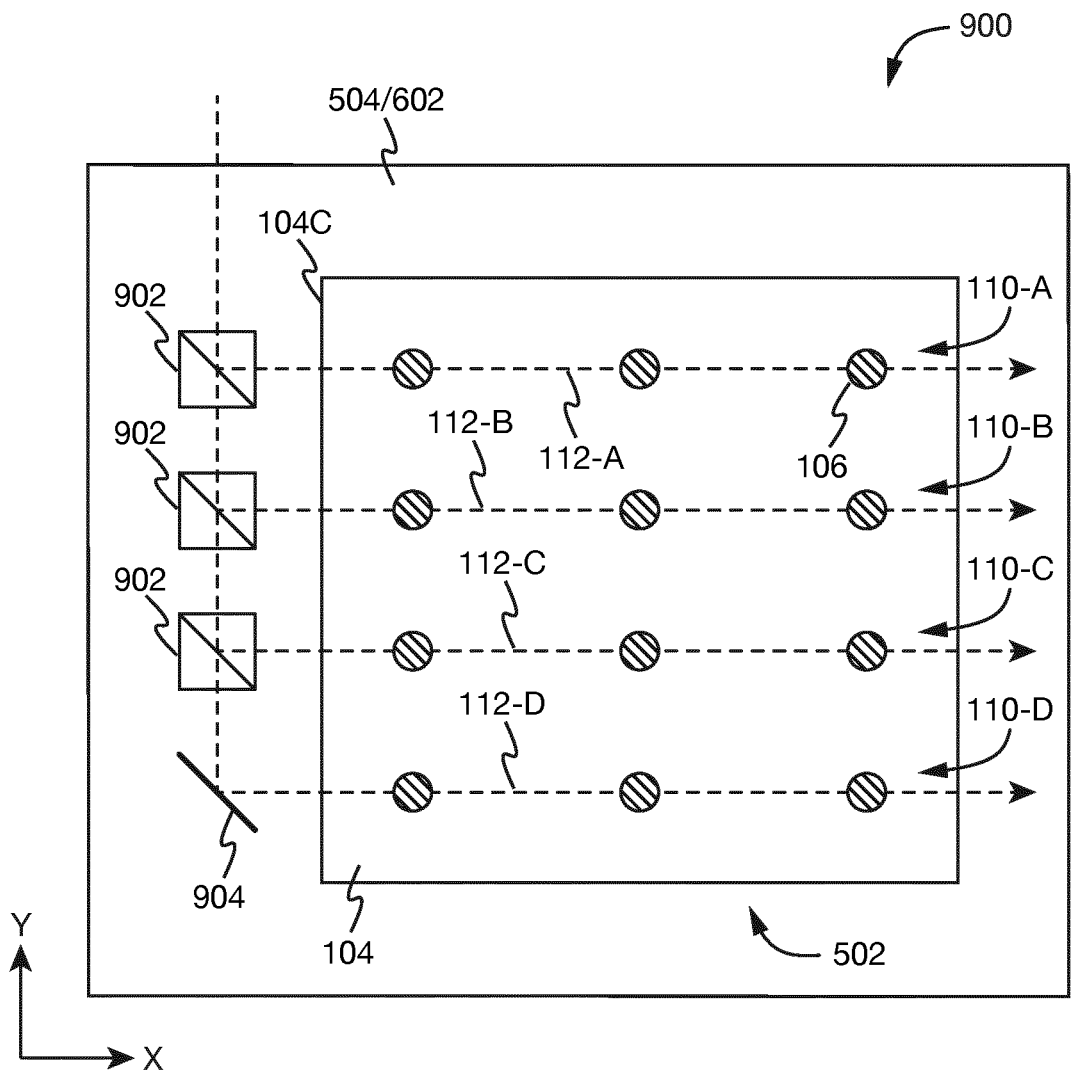
Figure 9B:
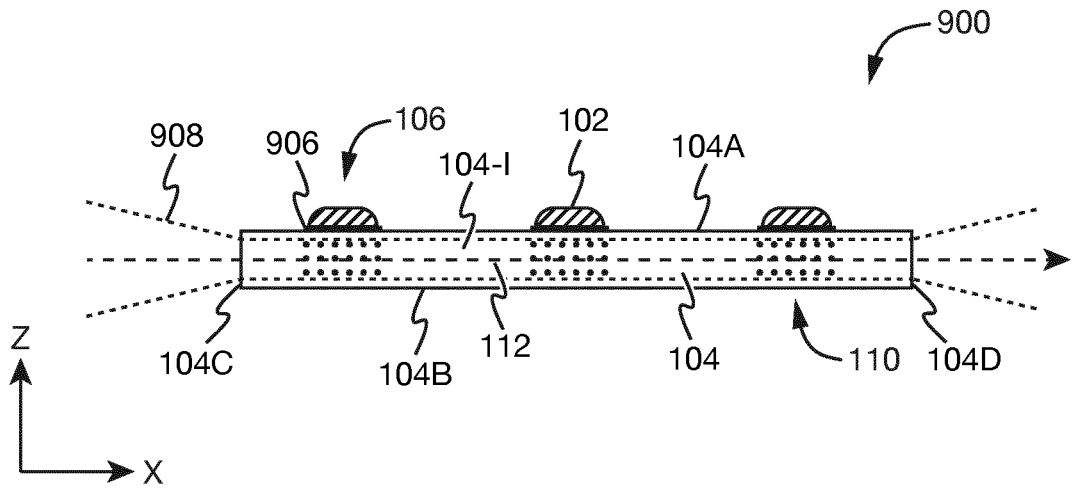

In the following, a detailed description of the invention and exemplary embodiments thereof is given with reference to the figures. The figures show schematic illustrations of FIG. 1: a cross section of a sensor chip with a homogeneous distribution of spin systems according to an exemplary embodiment of the invention in side view;

FIG. 2a: a cross section of a sensor chip with a localized distribution of spin systems in accordance with an exemplary embodiment of the invention in side view;

FIG. 2b: the sensor chip of FIG. 2a in top view;

FIG. 3: a sensor chip having side faces with retroreflecting structures according to an exemplary embodiment of the invention in top view;

FIG. 4: a sensor chip comprising a two-dimensional waveguide in accordance with an exemplary embodiment of the invention in top view;

FIG. 5: a system for parallelized magnetic sensing on a plurality of samples according to an exemplary embodiment of the invention;

FIG. 6: a sensor chip with a frame in accordance with an exemplary embodiment of the invention in top view;

FIG. 7: a flow diagram of a method for probing a plurality of samples using optically addressable solid-state spin systems in accordance with an exemplary embodiment of the invention;

FIG. 8: a flow diagram of a method for probing a plurality of samples by nuclear magnetic resonance spectroscopy according to an exemplary embodiment of the invention;

FIG. 9a: a sensor chip with a plurality of beam splitters in accordance with an ex-emplary embodiment of the invention in top view; and FIG. 9b: a cross section of the sensor chip of FIG. 9a in side view.

DESCRIPTION OF THE PREFERRED EMBODIMENTS

FIG. 1 depicts a schematic illustration of a sensor chip 100 for parallelized magnetic sensing of a plurality of samples 102 according to an exemplary embodiment of the invention in a cross-sectional side view (not to scale).

The sensor chip 100 comprises an optically transparent substrate 104, which in this example consists of diamond. The substrate 104 may for example be a slab of diamond with a top surface 104A and a bottom surface 104B opposing the top surface 104A. A thickness of the substrate 104 from the top surface 104A to the bottom surface 104B may e.g. be between 10 µm and 1 mm and a length and width parallel to the top surface may e.g. be between 0.5 mm and 1 cm. Preferably, the diamond crystal structure has a well-defined orientation relative to the top surface 104A. For example, a crystal axis of the diamond lattice may be oriented at a pre-defined angle relative to the normal vector of the top surface 104A. In the context of this disclosure, spatially relative terms such as "top", "bottom" and the like are used for illustrative purposes only, e.g. to describe relationships between elements or features as illustrated in the figures. These terms are intended to encompass different orientations of the respective object such as the sensor chip 100 in use or operation in addition to the orien-tation depicted in the figures. The sensor chip 100 and other objects may be otherwise orient-ed (e.g. rotated by 90 degrees or at other orientations) and the spatially relative terms used herein may likewise be interpreted accordingly.

The samples 102 are arranged on a plurality of sample sites 106, which in this example are microfluidic sample wells. In other examples, the sample sites 106 may e.g. be hydrophilic areas on the top surface 104A, for example as detailed below with reference to FIG. 9b. The microfluidic sample wells 106 are formed in a well layer 108 arranged on the top surface 104A of the substrate 104. The sample wells 106 may for example be arranged on the top surface 104A in a one-dimensional pattern or in a two-dimensional pattern as described below with reference to FIGS. 2-4, 6 and 9. In some embodiments, the pattern may be periodic. The samples 102 may for example be microdroplets of a sample fluid, which may e.g. be a medical sample fluid such as a blood sample of a patient, a chemical sample fluid comprising one or more reagents and/or products of a chemical reaction, and/or a biological sample fluid, which may e.g. comprise biological objects such as cells, proteins or DNA. The well layer 108 may for example comprise or consist of glass, a polymer material, and/or a photoresist that can be structured by photolithography, e.g. a polymer photoresist. In the example of FIG. 1, the well layer 108 is removed completely in the sample wells 106 and a bottom wall of the sample wells 106 is formed by the top surface 104A of the substrate 104. In other examples, a thin layer of the well layer 108 may remain on the bottom of the sample wells 106, e.g. to pro-tect the sample 102 from evanescent light leaking out of the substrate 104.

The substrate 104 comprises a plurality of optically addressable solid-state spin systems, in this example nitrogen-vacancy (NV) centers embedded in the diamond crystal structure. The NV centers may in particular be in a negative charge state, which exhibits a triplet electronic ground state with a spin of S=1. The spin state of the NV centers may be manipulated using microwaves and may be read-out and/or initialized via optical transitions to an excited triplet state, e.g. through spin-dependent fluorescence in the excited state. This allows for using NV centers as nanoscale magnetometers for measuring magnetic fields, for example through optically detected magnetic resonances (ODMR).

The NV centers are arranged in a plurality of sensing regions 110 in a surface layer 104-I below the top surface 104A of the substrate 104. In the example of FIG. 1, the NV centers are distributed homogeneously throughout the surface layer 104-I. The surface layer 104-I may for example extend from the top surface 104A into the substrate 104 to a depth between 2 μm and 500 μm, in one example between 10 μm and 20 μm. A density of NV centers in the surface layer 104-I may for example be between $10^{15}$ cm$^{-3}$ and $10^{18}$ cm$^{-3}$, e.g. between $10^{16}$ cm$^{-3}$ and $10^{17}$ cm$^{-3}$ in one example. In some examples, the NV centers may be distributed throughout the entire substrate 104, i.e. the depth of the surface layer 104-I may be equal to the thickness of the substrate 104.

The sensor chip 100 further comprises a light guiding system that is configured to provide an optical path 112 through the substrate 104, wherein the optical path 112 connects each of the sensing regions 112 and comprises at least two segments that are not parallel to each other. In the example of FIG. 1, the light guiding system comprises two reflective coatings 114, 116 on the top and bottom surface 104A, 104B, respectively. The optical path 112 extends within the substrate 104 from a first side face 104C towards an opposing second side face 104D and forms a zig-zag pattern between the top and bottom surfaces 104A, 104B, at which reflections occur at the respective coating 114, 116. The entrance angle α of the optical path 114 relative to a normal vector of the top and/or bottom surface 104A, 104B is chosen such that light propagating along the optical path 114 is reflected off the coating 114 on the top surface 104A at the center of each of the sample wells 106, thereby defining the corresponding sensing regions 110 within the surface layer 114-I. In other words, each of the sensing regions 110 is arranged below a respective one of the sample wells 106. The first side face 104C comprises an angled entrance facet for coupling a light beam into the optical path 112, wherein the angled entrance facet may for example be orthogonal to the optical path 112, i.e. may form an angle equal to the entrance angle α with the top and/or bottom surface 104A, 104B. In some embodiments, the entire first side face 104C may be angled. Preferably, the angled entrance facet only covers a portion of the first side face 104C, wherein the angled entrance facet may e.g. be tilted relative to the remaining portion of the first side face 104 around one or two axes, e.g. around the direction of view of FIG. 1 and/or around the Z axis of FIG. 1. This may for example allow for coupling the light beam into the optical path 112 through the angled entrance facet at a 90° angle while also reflecting the light beam propagating along the optical path 112 off the first side face 104C, e.g. by total internal reflection, at a different point on the first side face 104C, for example similar to the sensor chip 200 of FIGS. 2a, 2b.

In the example of FIG. 1, the reflective coating 114 on the top surface 104A is a broadband reflective coating and the reflective coating 116 on the bottom surface 104B is a dichroic reflective coating. The broadband reflective coating 114 may for example be configured to reflect light between 400 nm and 1100 nm. The broadband reflective coating 114 thus reflects light at an absorption wavelength that may be used to excite NV centers to the excited electronic state, wherein the excitation may involve the emission of one or more phonons in the substrate 104, i.e. the absorption wavelength may be shorter than the intrinsic wavelength of the electronic transition of the NV center. The absorption wavelength may e.g. be between 500 nm and 600 nm, preferably at 532 nm. The broadband reflective coating 114 further reflects light at emission wavelengths at which NV centers decaying from the excited electronic state to the electronic ground state may fluoresce, wherein the emission wavelengths may be longer than the absorption wavelength due to the emission of phonons and/or due to other transitions, in particular non-radiative transitions, involved in the decay from the excited electronic state. The emission wavelength may e.g. be between 635 nm and 800 nm and/or between 1000 nm and 1100 nm. The dichroic reflective coating 116 may for example be a long-pass coating that transmits light at the emission wavelengths, e.g. wavelengths larger than 630 nm or larger than 650 nm, and reflects light at the absorption wavelength, e.g. wavelengths smaller than 630 nm or smaller than 650 nm.

In other embodiments, the sensor chip 100 may not comprise the reflective coating 114 and/or the reflective coating 116. Instead, the optical path 112 may be formed such that light propagating along the optical path 112 is reflected off the top and/or bottom surfaces 104A, 104B by total internal reflection. Accordingly, the entrance angle α of the optical path relative to a normal vector of the top and/or bottom surface 104A, 104B may be chosen to be larger than the critical angle for total internal reflection at the respective surface, e.g. larger than the critical angle at a diamond-air interface) (24.5°, a diamond-water interface (33.4°), or a diamond-glass interface) (38.5°. In one example, the entrance angle α is between 35° and 60°.

FIGS. 2a and 2b depict a sensor chip 200 according to another exemplary embodiment of the invention. FIG. 2a shows a cross-sectional side view of the sensor chip 200 (not to scale) and FIG. 2b shows a top view of the sensor chip 200 (not to scale). The sensor chip 200 is similar to the sensor chip 100 of FIG. 1 and also comprises a diamond substrate 104, in which NV centers are embedded in a surface layer 104-I. In contrast to the sensor chip 100, the NV centers are confined to the sensing regions 110 in the substrate 104 of the sensor chip 200. The concentration of NV centers in the substrate 104 outside of the sensing regions 110 may for example be at least a factor of 100, preferably at least a factor of 1000 smaller than in the sensing regions 110. In one example, the density of NV centers in the sensing regions 110 is between $10^{16}$ cm$^{-3}$ and $10^{18}$ cm$^{-3}$, whereas the density of NV centers in the remaining parts of the substrate is below $10^{15}$ cm$^{-3}$, preferably below $10^{14}$ cm$^{-3}$.

In the example of FIG. 2a, the optical path 112 extends parallel to the surface layer 104-I between the sensing regions 110 and does not intersect with the top and bottom surfaces 104A, 104B of the substrate 104. The light guiding system comprises reflective coatings 202, 204 on opposing side faces 104C, 104D, which are perpendicular to the top and bottom surfaces 104A, 104B. The optical path 112 enters the substrate 104 through the side face 104C at an entrance angle β relative to a normal vector of the side face 104C, wherein the entrance angle β is measured in a plane parallel to the top surface 104A of the substrate 104 (in other words, the entrance angles α and β are the polar and azimuthal angle, respectively, relative to the normal vector of the top surface 104A). The entrance angle β is chosen such that the optical path 112 forms a zig-zag pattern in the surface layer 104-I between the side faces 104C, 104D, sequentially passing through each of the sensing regions 110 arranged below the sample wells 106. In some examples, the side face 104C may comprise an angled entrance facet for coupling a light beam into the optical path 112, e.g. as described above for the sensor chip 100. The angled entrance facet may for example be tilted relative to side face 104C around the Y axis and/or around the Z axis of FIG. 2a, 2b.

In other embodiments, the substrate 104 may not comprise one or both of the reflective coatings 202, 204 and the entrance angle β may be chosen such that total internal reflection occurs at the respective side face 104C, 104D. In some embodiments, the optical path 112 may also comprise reflections off the top and/or bottom surfaces 104A, 104B of the substrate 104, e.g. similar to the sensor chip 100 of FIG. 1. In one embodiment, the optical path 112 may e.g. not extend parallel to the surface layer 104-I, but may comprise a single reflection off the top surface 104A or a coating layer arranged thereon between each pair of subsequent reflections off the side faces 104C, 104D, preferably at the center of the top surface 104A half way between the side faces 104C, 104D. Segments of the optical path 112 may for example extend at a small angle relative to the top surface 104A, wherein the angle may for example be between ±0.5° and ±5°, i.e. the entrance angle α relative to the normal vector of the top surface 104A (cf. FIG. 1) may e.g. be between 85° and 89.5°. Preferably, the side faces 104C, 104D are tilted by the same angle relative to the normal vector of the top surface 104A such that the segments of the optical path 112 are perpendicular to the side faces 104C, 104D in the x-z plane of FIG. 2a, e.g. such that the optical path 112 maintains its angle relative to the top surface 104A upon reflection off the side faces 104C, 104D. In other embodiments, the thickness of the substrate 104 may be chosen to be sufficiently small such that the top and bottom surface 104A, 104B of the substrate 104 form a planar waveguide, e.g. as detailed below with reference to FIG. 9b.

Each of the sensing regions 110 is arranged below a respective one of the sample wells 106. Preferably, the sample wells 106 are slightly larger than the sensing regions 110 in a plane parallel to the top surface. A width or diameter of the sample wells 106 may for example be between 5% and 25% larger than the width of diameter of the sensing regions 110. In other examples, side walls of the sample wells 106 may be aligned with boundaries of the sensing regions 110. In the example of FIGS. 2a, 2b, the sample wells 106 and the sensing regions 110 both have a circular shape with a diameter $d_1$, which may e.g. be between 2 μm and 500 μm, in one example between 10 μm and 100 μm. In other examples, the sample wells 106 and/or the sensing regions 110 may have a rectangular or quadratic shape, which may e.g. be advantageous for NMR applications. The sample wells 106 may for example enclose a volume between 1 picoliter and 1 microliter, in one example between 50 picoliter and 10 nanoliter. The sensing regions 110 are arranged in a periodic pattern in a plane parallel to the top surface 104A, wherein a distance $d_2$ between adjacent sensing regions 110 is at least two times as large, preferably at least five times as large as the diameter $d_1$ of the sensing regions 110 in order to prevent crosstalk between adjacent sensing regions 110 and/or samples 102 and to facilitate the independent detection of optical signals from adjacent sensing regions 110.

In contrast to the sensor chip 100, the sensor chip 200 does not comprise a well layer. Instead, the sample wells 106 are formed in the substrate 104 itself as depressions or cut-outs in the top surface 104A. On the opposing bottom surface 104B, a plurality of solid immersion lenses 206 are arranged, wherein each of the solid immersion lenses 206 is aligned with a respective one of the sensing regions 110 to facilitate collection of light emitted from the respective sensing region 110. The solid immersion lenses 206 may for example be hemispherical or Weierstrass solid immersion lenses and may comprise an optically transparent material with the same refractive index or a higher refractive index than the substrate 104, i.e. than diamond. Preferably, the solid immersion lenses 206 also comprise or consist of diamond and are e.g. formed by an appropriate structuring of the bottom surface 104B.

FIG. 3 depicts a schematic illustration of a sensor chip 300 in accordance with another exemplary embodiment of the invention in top view (not to scale). The sensor chip 300 is similar to the sensor chip 200 described above and also comprises a diamond substrate 104, in which NV centers are arranged in sensing regions underneath sample sites 106 on a top surface of the substrate 104, wherein the sample sites 106 may e.g. be microfluidic sample wells as described above or hydrophilic areas on the top surface 104A of the substrate 104.

Instead of the reflective coatings 202, 204 on the side face 104C, 104D of the substrate 104, the light guiding system of the sensor chip 300 comprises a plurality of retroreflecting structures 302 on the side faces 104C, 104D. Each of the retroreflecting structures 302 comprises a pair of angled surfaces 302A, 302B, which are orthogonal to each other and e.g. extend at an angle of +45° and −45°, respectively, relative to a normal vector of the respective side face, wherein the normal vector of the respective side face is the normal vector of a plane connecting the corners of the substrate 104 connected by the side face. Preferably, the retroreflecting structures 302 are formed by the side faces 104C, 104D, which may e.g. have been structured accordingly. In other embodiments, the retroreflecting structures 302 may be attached on the side faces 104C, 104D or may be located outside of the substrate 104, e.g. as detailed below with reference to FIG. 6. The retroreflecting structures 302 may be arranged with equidistant spacing, wherein the retroreflecting structures 302 at one of the side faces 104C, 104D are displaced by half a period relative to the retroreflecting structures 302 at the other one of the side faces 104C, 104D.

The pair of mutually orthogonal surface 302A, 302B reflects an incoming beam back with a finite displacement relative to the incoming beam as shown in FIG. 3, e.g. by total internal reflection or by a reflective coating on the surfaces 302A, 302B. In this way, the optical path 112 may form a meandering pattern that passes through each of the sensing regions 110 below the sample sites 106 and comprises a plurality of parallel segments connected by orthogonal segments between the angled surfaces 302A, 302B of the retroreflecting structure 302.

In the example of FIG. 3, the angled surfaces 302A, 302B are curved surfaces, in particular convex surfaces that act as focusing elements for light propagating along the optical path that is reflected off the respective angled surface 302A, 302B. In one example, the curva-tures of the surfaces 302A, 302B may be chosen such that an effective focal length of the retroreflecting structure 302 is equal to one half of the path length between opposing retroreflecting structures 302, i.e. such that retroreflecting structures 302 that are adjacent along the optical path 112 form a 4f telescope that is configured to image the intensity distribution at a first center point between the side faces 104C, 104D along the optical path 114 onto a second center point between the side faces 104C, 104D along the optical path 114. In other examples, each retroreflecting structure 302 may be configured to image the intensity distribution at the closest center point in front of the respective retroreflecting structure onto the closest center point after the respective retroreflecting structure. In one example, each of the angled surface 302A, 302B may have a focal length equal to one half of the distance between adjacent angled surfaces 302A, 302B on opposing side faces of the substrate 104.

FIG. 4 depicts a schematic illustration of a sensor chip 400 according to another ex-emplary embodiment of the invention in top view (not to scale). In this example, the light guiding system comprises a two-dimensional waveguide 402 that is formed in the substrate 104 and provides the optical path 112 connecting each of the sensing regions 110 arranged below the sample sites 106. In one example, the substrate 104 consists of diamond and the waveguide 402 corresponds to a rib-shaped or fin-shaped protrusion on the top and/or bottom surface of the substrate 104, e.g. as described in Y. Zhang et al., *Diamond and Related Materials* 20, 564-567 (2011). Preferably the sensing regions 110 are formed in the waveguide 402 itself. A well layer may be arranged above the top surface of the substrate 104 to form sample wells 106 above the waveguide 402, e.g. as described above with reference to FIG. 1. In other embodiments, the substrate 104 may be a composite substrate 104 comprising a carrier material, e.g. glass or a polymer material, that the waveguide 402 is formed on or embedded in, wherein the waveguide 402 preferably comprises diamond and contains the sensing regions 110.

FIG. 5 depicts a schematic illustration of a system 500 for parallelized magnetic sensing on a plurality of samples 102 according to an exemplary embodiment of the invention (not to scale). The system 500 is configured for use with a sensor chip 502 comprising an optically transparent substrate 104 with a plurality of optically addressable solid-state spin systems (not shown), e.g. a diamond substrate comprising NV centers. The spin systems are arranged in a plurality of sensing regions (not shown) in a surface layer below a top surface 104A of the substrate 104, wherein the samples 102 may e.g. be arranged on the top surface 104A adjacent to a respective one of the sensing regions. In some embodiments, the sensor chip 502 may for example be similar to one of the sensor chips 100, 200, 300, and 400 described above or to the sensor chip 600 or 900 described below. In other examples, the sensor chip 502 may not comprise a light guiding system, but may for example be a diamond slab without reflective coatings, retroreflecting structures and/or waveguides.

The system 500 comprises a mount 504 that is configured to receive the sensor chip 502. The mount 504 may for example comprise a frame that is configured to carry to the sensor chip 502 and one or more fasteners (not shown) such as clips and/or screws for attaching the sensor chip 502 to the frame. In some embodiments, the frame may comprise a recess or cutout that the sensor chip can be arranged in, e.g. as detailed below with reference to FIGS. 6, 9a, and 9b. In some examples, the mount 504 may be adjustable and may allow for moving and/or tilting the sensor chip 502 along one or more directions.

The system 500 further comprises an illumination system 506 that is configured to couple a laser beam generated by a laser source 508 into an optical illumination path 112 through the substrate 104 to excite NV centers in the sensing regions 110. The illumination path 112 sequentially intersects with each of the sensing regions and may e.g. correspond to the optical path of one of the sensor chips 100, 200, 300, and 400 described above or of one of the sensor chips 600 and 900 described below. In examples, in which the sensor chip 502 does not comprise a light guiding system, the illumination path 112 may e.g. comprise one or more reflection points at which the laser beam is reflected off a surface of the substrate by total internal reflection, e.g. similar as shown in FIG. 1 and/or FIGS. 2a, 2b, or may be a straight line extending parallel to the top surface 104A of the substrate 104. In some embodiments, the illumination system 506 may also comprise one or more reflecting elements such as micromirrors and/or one or more beam splitters to define the illumination path 112, e.g. as detailed below with reference to FIGS. 6, 9a, and 9b

The illumination system 506 comprises an alignment subsystem that is configured to align an ingoing optical path 510, along which the laser beam emitted by the laser source 508 travels, with the illumination path 112. The alignment subsystem comprises one or more adjustable optical elements such as an adjustable mirror 506A to couple the laser beam into the illumination path 112. The adjustable mirror 506A may in particular be an actuated mirror, e.g. a piezo-actuated mirror.

The illumination system 506 further comprises a beam shaper 506B, merely symboli-cally represented in FIG. 5 by two-sided arrows, wherein the beam shaper may for example be configured to adjust a beam diameter, an intensity profile, a phase pattern, a pulse energy and/or a pulse length of the laser beam emitted by the laser source 508. For this, the beam shaper 506B may e.g. comprise one or more lenses, an acousto-optic modulator, an electro-optic modulator, and/or a spatial light modulator. The beam shaper 506B may for example be configured to generate laser pulses from a continuous-wave laser beam emitted by the laser source 508 and to adjust the beam diameter of the laser beam to a size of the sensing regions of the sensor chip 502. In a preferred embodiment, the beam shaper 506B is configured to convert the laser beam generated by the laser source 508 to a Bessel beam and may e.g. comprise a reflective or refractive axicon. In some examples, the beam shaper 506B may be configured to change the intensity profile of the laser beam generated by the laser source 508 to a flat-top profile and/or to an elongated profile, e.g. an elliptical profile, in particular a light sheet. The light sheet may for example have an aspect ratio between 1:10 and 1:50. A width of the light sheet may be chosen such that the laser pulse illuminates sensing regions in two or more adjacent rows of sensing regions at the instant of time, i.e. the width may e.g. be larger than two times, in one example larger than five times the distance between adjacent sensing regions.

The laser source 508 may be part of the system 500 or may be provided as an independent unit. The laser source 508 emits light at an absorption wavelength of the NV centers, for example between 500 nm and 600 nm, preferably at 532 nm. In one example, the laser source 508 is a diode-pumped solid-state laser.

The system 500 further comprises a magnet for applying a bias magnetic field to the substrate 104 and the samples 102. In the example of FIG. 5, the magnet is formed by a pair of coils 512A, 512B that are arranged adjacent to the sensor chip 502 and configured to be connected to a current source (not shown) for applying the bias magnetic field. In some examples, the system 500 may also comprise the current source. The system 500 may for example be configured to apply a bias magnetic field with a variable field strength, which may e.g. be adjusted within the range of 0 mT to 1 T, in one example within the range of 0 T and 5 T. In one example, the coils 512A, 512B may be superconducting coils.

The system 500 also comprises a microwave antenna 514 that is configured to be connected to a microwave generator (not shown) for applying a microwave signal to the substrate 104 and the samples 102, e.g. a sequence of microwave pulses schematically shown in FIG. 5. The microwave antenna 514 may for example be a wire, a coil or a horn antenna. The microwave antenna 514 may for example be configured to emit microwave signals with a frequency adapted to the strength of the bias magnetic field. Typical microwave frequencies may for example be a few hundred MHz for a bias magnetic field of 0.1 T, on the order of 25 GHz for a bias magnetic field of 1 T, and on the order of 125 GHz for a bias magnetic field of 5 T. The microwave antenna 514 may e.g. be configured to emit microwave signals at least within the frequency range of 10 GHz to 50 GHZ, in one example at least down to a frequency 300 MHZ and in one example at least up to a frequency of 125 GHz. In some examples, the system 500 may also comprise the microwave generator, wherein the microwave generator may for example be an arbitrary waveform generator. In some embodiments, the system 500 may comprise a microwave resonator (not shown) instead of or in addition to the microwave antenna 514.

The system 500 further comprises an imaging system 516 that is configured to collect light emitted by solid-state spin systems in the sensing regions in the substrate 104. The imaging system is in particular configured to simultaneously determine an intensity of the emitted light for each of the sensing regions. For this, the imaging system 516 comprises an objective 518 facing the bottom surface of the substrate 104, wherein the objective 518 is configured to collect light emitted from the sensing regions. The imaging system 516 is configured to image the emitted light onto a detector 522 along an imaging path 520. In this example, the detector 522 is a multichannel photodetector comprising a plurality of photosensitive elements or channels 524, wherein each channel 524 is associated with a respective one of the sensing regions and configured to measure an intensity of the light incident on the channel 524. The channels 524 may for example be photodiodes, i.e. the detector 522 may comprise an array of photodiodes. Each of the channels 524 may comprise a single photodiode or a plurality of photodiodes. Alternatively, the channels may be regions on an extended photodetector, e.g. a CCD or CMOS chip, wherein each channel may for example comprise a plurality of pixels of the photodetector. In one example, the detector may be a lock-in camera configured to determine differential signals by subtracting signals of two subsequent measurement, preferably prior to analog-to-digital conversion of the signals. In some embodiments, the detector 522 or the imaging system 516 may comprise one or more additional focusing elements, e.g. a respective microlens associated with each channel 524 of the detector 522 or a respective microlens associated with each photodiode or pixel of the detector 522. The imaging system 516 is configured to image the light emitted from each of the sensing regions onto the respective channel 524.

In other embodiments, the imaging system 516 may comprise one or more detection light guides (not shown) that are configured to collect light emitted from a respective one of the sensing regions. Entrance facets of the light guides may for example be arranged adjacent to or in contact with the bottom surface of the substrate 104, e.g. underneath the respective sensing region. Output facets of the light guides may e.g. be coupled to a respective photodetector directly, e.g. to a photodiode.

In some examples, the system 500 may further comprise a controller (not shown) that is configured to control the mount 504, the illumination system 506, the laser source 508, a current source connected to the coils 512A, 512B, a microwave generator connected to the microwave antenna 514, and/or the detector 522. The controller may be implemented in hardware, software or a combination thereof and may for example be configured to execute one of the methods 700 and 800 described below at least in part.

FIG. 6 schematically illustrates a sensor chip 600 according to an exemplary embodiment of the invention in top view (not to scale). The sensor chip 600 is similar to the sensor chips 200 and 300 described above. The sensor chip 600 also comprises a diamond substrate 104, in which NV centers are arranged in sensing regions below a plurality of sample sites 106 on a top surface of the substrate 104, and a light guiding system configured to provide an optical path 112 through the substrate 104 connecting each of the sensing regions 110.

The sensor chip 600 further comprises a frame 602, in which the substrate 104 is arranged. The frame 602 may for example consist or comprise of metal, glass, plastic, or a combination thereof and may comprise a cut-out or hole in the center, in which the substrate 104 can be placed such that the top and bottom surfaces of the substrate 104 are accessible. The frame 602 further comprises a microwave antenna or resonator 514 formed by or comprising a wire surrounding the substrate 104. The wire 514 may e.g. be arranged on or embedded in the frame 602 and may comprise a connector for connecting the wire 514 to a microwave generator. In other examples, the wire 514 may additionally or alternatively be used for applying a magnetic field to the substrate 104 and the samples and may e.g. be connected to a current source. In some examples, the sensor chip 600 may not comprise the frame 602, but the frame 602 as well as the elements arranged thereon may be part of a sensor chip mount of a system for parallelized magnetic sensing according to the invention, e.g. the mount 504 of the system 500.

The light guiding system comprises a lateral opening 604 in the frame 602 providing optical access to an entrance facet on a side face of the substrate 104 for coupling light into the optical path 112. The light guiding system further comprises a plurality of retroreflecting structures 606 for reflecting light propagating along the optical path 112. The retroreflecting structures 606 are similar to the retroreflecting structures 302 of the sensor chip 300 in FIG. 3, but are not part of the substrate 104 and are arranged on the frame 602 instead. Each of the retroreflecting structures 606 may for example comprise a pair of micromirrors that are oriented at a 90° angle with respect to each other and may also be curved as illustrated in FIG. 6. In some embodiments, the retroreflecting structure 606 may also be part of the illumination system of a system for parallelized magnetic sensing according to the invention, e.g. the illumination system 516 of the system 500.

FIG. 7 shows a flow diagram of a method 700 for probing a plurality of samples using optically addressable solid-state spin systems in accordance with an exemplary embodiment of the invention. The method 700 may for example be implemented with one of the sensor chips 100, 200, 300, 400, 600, and 900 and/or with the system 500 and will be described in the following using the sensor chip 100 and the system 500 as an example. The method 700 is not limited to the order of execution indicated by the flow diagram of FIG. 7. As far as technically feasible, the method 700 may be executed in an arbitrary order and steps thereof may be executed simultaneously at least in part, e.g. steps 704 and 706 described below.

The method 700 comprises, in step 702, preparing the samples 102 on the sensor chip 100. The samples 102 may for example be chemical sample fluids, e.g. solutions containing reagents and/or products of chemical reactions. In some embodiments, each of the samples 102 may be different and may e.g. comprise different concentrations and/or substances than the other samples 102. The samples 102 may for example be prepared on the sensor chip 100 by placing a microdroplet of each sample 102 into a respective one of the sample wells 106 on the top surface 104A of the substrate 104 above the sensing regions 110. The microdroplet may for example have a volume between 10 picoliter and 1 nanoliter.

In step 704, the sensing regions 110 are illuminated simultaneously to optically excite solid-state spin systems, i.e. NV centers in the sensor chip 100, in each of the sensing regions 110. For this, a laser pulse may be generated using the laser source 508 and the illumination system 506, wherein the wavelength of the pulse is chosen to match an excitation wavelength of the NV centers, e.g. 532 nm. The laser pulse is coupled into the optical path or illumination path 112 using the illumination system 506, e.g. through the side face 104C of the substrate 104 or by coupling into a waveguide such as the two-dimensional waveguide 402 in FIG. 4 or a planar waveguide as in FIG. 9b. Subsequently, the laser pulse propagates through each of the sensing regions one after the other, thereby exciting NV centers in the sensing regions from the electronic ground state to the electronic excited state. The sensing regions 110 may for example be illuminated to optically polarize the spin systems therein or for an optical read-out of the state of the spin system, e.g. as detailed below. In some examples, the sensing regions 110 may be illuminated multiple times, e.g. for an optical polarization at the beginning of an experimental sequence and for an optical read-out at the end of the optical sequence. A pulse energy and/or pulse length of the laser pulse may for example be chosen so as to achieve a pre-defined transition probability for the NV centers in the sensing regions into a certain state, e.g. as detailed below. This may in particular involve choosing the pulse energy and/or pulse length such that the spin systems undergo multiple excitations, e.g. for optical polarization of the spin system.

As detailed above, propagation of the laser pulse along the illumination path 112 may comprise one or more reflections, e.g. off the top surface 104A of the substrate 104 in the vicinity of each of the sensing regions 110 as illustrated in FIGS. 1 and 5 and/or off one or more surfaces perpendicular to a plane in which the sensing regions 110 are arranged as illustrated in FIGS. 2, 3 and 6. The illumination path 112 may be adapted to a distribution of the NV centers in the substrate 104, e.g. by adjusting the entrance angles $\alpha$ and/or $\beta$ of the illumination path 112. Additionally or alternatively, a diameter of the laser pulse may be adapted to the distribution of NV centers. In particular, the illumination path 112 and/or the pulse diameter may be adapted such than only NV centers in the sensing regions 110 are excited, e.g. by choosing the entrance angle $\alpha$ and the diameter such that the pulse propagating along the illumination path 112 only illuminates the surface layer 104-I in the sensing regions 110.

In step 706, optical signals emitted by NV centers in the sensing regions 110 are detected independently for each of the sensing regions 110, e.g. by imaging fluorescence light emitted from the NV centers in the sensing regions 110 onto a respective channel 524 of the detector 522. This may comprise determining an intensity, e.g. a peak intensity and/or a time-integrated intensity, of the light emitted from each of the sensing regions. Step 706 may further comprise determining information pertaining to the state of the NV centers in each of the sensing regions 110 prior to illumination from the determined intensity, e.g. an occupa-tion probability of one or more spin states in the electronic ground state. For this, the method 700 may also comprise applying a microwave signal and/or a radio-frequency (rf) signal to the substrate 104 and the samples 102 arranged thereon, e.g. as detailed below for the method 800. Step 706 may further comprise determining information pertaining to a strength and/or orientation of a magnetic field at each of the sensing regions 110 from the information pertaining to the state of the NV centers. Preferably, the detection is performed along an axis perpendicular to the plane in which the sensing regions arranged, e.g. through the top surface 104A or more preferably through the bottom surface 104B of the substrate 104. Accordingly, the detection axis may also be perpendicular to the plane, in which the illumination path 114 extends, which may minimize interference between illumination and detection.

FIG. 8 shows a flow diagram of a method 800 for probing a plurality of samples by nuclear magnetic resonance spectroscopy using optically addressable solid-state spin systems according to an exemplary embodiment of the invention. The method 800 is similar to the method 700 and may for example be implemented with one of the sensor chips 100, 200, 300, 400, 600, and 900 and/or with the system 500. In the following, the method 800 will be described using the sensor chip 100 and the system 500 as an example. The method 800 is not limited to the order of execution indicated by the flow diagram of FIG. 8. As far as technically feasible, the method 800 may be executed in an arbitrary order and steps thereof may be executed simultaneously at least in part, e.g. at least some of steps 804 to 812 described below.

Similar to the method 700, the method 800 also comprises preparing the samples 102 on the sensor chip 100 in step 802, e.g. as described above for step 702 of method 700. The method 800 further comprises applying a bias magnetic field to the substrate 104 and the samples 102 arranged thereon in step 804, e.g. using the coils 512A, 512B. This may also comprise varying a strength and/or orientation of the magnetic field. The bias magnetic field may for example be used to define a quantization axis for the spin of the NV centers and/or of objects in the samples 102 and/or to adjust an energy splitting between states of the NV centers and/or of objects in the samples 102, e.g. to create a degeneracy or level crossing between states. The bias magnetic field may be applied continuously, e.g. during some or all of steps 806 to 812.

The method 800 further comprises, in step 806, illuminating the sensing regions 110 to optically polarize the spin systems therein, e.g. to prepare the spin systems in a pre-defined initial state. Preferably, the sensing regions 110 are illuminated by light propagating along the illumination path 112 to simultaneously excite the spin systems, e.g. using one or more laser pulses. Depending on the transition rates between states of the spin systems, optical polarization may require a large number of optical transitions, e.g. multiple excitations of the spin systems, and thus sufficiently large light intensities in the sensing regions 110. Accordingly, re-using the same laser pulse for each of the sensing regions via the illumination path may reduce the amount of laser power required for the optical polarization. An intensity and/or duration of the laser pulse may for example be adjusted to achieve a pre-defined pumping efficiency, e.g. such that at least 90%, preferably at least 99% of all spin systems are transferred to the initial state.

In step 808, a microwave signal and/or a radio-frequency (rf) signal is applied to the substrate 104 and the samples 102 arranged thereon, e.g. using the microwave antenna 514. This may also comprise varying an amplitude, polarization, and/or frequency of the microwave signal and/or of the rf signal. The microwave and/or rf signals may in particular comprise one or more pulse sequences. Each of the microwave and/or rf pulse sequences may e.g. comprise one or more $\pi/2$ pulses and/or $\pi$ pulses, for example to manipulate a spin state of the NV centers and/or of objects such as atoms, molecules or macromolecules in the samples 102. The pulse sequences may in particular be pulse sequences for performing nuclear magnetic resonance (NMR) spectroscopy.

In steps 810 and 812, the sensing regions 110 are illuminated to optically excite the NV centers therein and the fluorescence intensity emitted from each of the sensing regions 110 is measured, e.g. as described above for method 700. Some or all of steps 804 to 812 may be repeated multiple times and/or may be executed simultaneously at least in part. In a preferred embodiment, NV centers in the sensing regions 110 are read out using a coherently averaged synchronized readout (CASR) scheme comprising alternating blocks of synchronized microwave pulse sequences and illumination pulses for read out, e.g. as described in D. R. Glenn et al., *Nature* 555, 351-354 (2018) and WO 2018/052497 A2.

FIGS. 9a and 9b schematically illustrates a sensor chip 900 according to an exemplary embodiment of the invention, wherein FIG. 9a shows the sensor chip 900 in top view (not to scale) and FIG. 9b shows a cross-sectional side view (not to scale) of the sensor chip 900. The sensor chip 900 is similar to the sensor chip 600 described above and also comprises a substrate 104 with a plurality of sensing regions 110 that is arranged in a frame 602.

In this example, the sensing regions 110 form a plurality of sets 110-A, 110-B, 110-C, 110-D, each of which may for example comprise a plurality of sensing regions 110 arranged along a straight line as illustrated in FIG. 9a. The sensor chip 900 comprises a light guiding system that is configured to provide a respective optical path 112-A, 112-B, 112-C, 112-D for each of the sets of sensing regions 110-A to 110-D, wherein each of the optical paths 112-A to 112-D connects each of the sensing regions 110 in the respective set. For this, the light guiding system comprises a plurality of beam splitters 902 that split an ingoing optical path into the optical paths 112-A to 112-D. The beam splitters 902 may for example be arranged on the frame 602 adjacent to a side face 104-C of the substrate 104. The light guiding system further comprises a micromirror 904 that light propagating along the optical path 112-D is reflected off. In some embodiments, the beam splitters 902 and the micromirror 904 may be adjustable, e.g. tiltable around one or two axes. The beam splitters 902 may be polarizing beam splitters or preferably non-polarizing beam splitters, wherein the ratio of transmission and reflection may for example be chosen such that incoming light is split into equal parts, i.e. such that the optical power is the same in each of the optical paths 112-A to 112-D. In other words, the reflectivity of the beam splitters 902 may increase from the first beam splitter to the last beam splitter along the ingoing optical path.

In some embodiments, the frame 602, the beam splitters 902, and/or the micromirror 904 may not be part of the sensor chip 900, but may be part of a system for parallelized magnetic sensing such as the system 500. In other words, the illumination system 506 may for example comprise the beam splitters 902 and/or the micromirror 904 for coupling a laser beam into the optical paths/illumination paths 112-A to 112-D, which sequentially intersect with the sensing regions 110 of the respective set 110-A to 110-D. Similarly, the frame 602 may form or be part of a mount configured to receive a sensor chip 502 consisting of or comprising the substrate 104.

In yet another example, the light guiding system of the sensor chip 900 or the illumination system 506 of the system 500 may be configured to couple laser beams generated by multiple laser sources into the paths 112-A to 112-D, e.g. using a respective laser source for each of the illumination paths 112-A to 112-D. The light guiding or illumination system may for example comprise micromirrors instead of the beam splitters 902, e.g. to couple a laser beam generated by a laser source into the respective path 112-A to 112-D.

The sensor chip 900 comprises a plurality sample sites 106, which in the example of FIG. 9b comprise hydrophilic coatings 906 on the top surface 104A of the substrate 104 that are configured to attract or bind microdroplets 102 of a sample fluid. In other examples, the sensor chip 900 may additionally or alternatively comprise microfluidic sample wells, e.g. similar to the sensor chips 100 and 200 described above.

The light guiding system of the sensor chip 900 comprises a waveguide formed in the substrate 104 to provide the optical paths 112-A to 112-D through the substrate 104. In this example, the thickness of the substrate 104 perpendicular to the top surface 104A is chosen to be sufficiently small such that the top and bottom surfaces 104A, 104B of the substrate 104 form a one-dimensional planar or slab waveguide. Light propagating along the optical paths 112-A to 112-D may for example be confined along the Z axis of FIG. 9b by total internal reflections off the top and bottom surfaces 104A, 104B. The thickness of the substrate 104 may for example be between 10 μm and 30 μm. Each of the optical paths 112-A to 112-D may extend along a straight line through the substrate 104 as shown in FIG. 9a. Additionally or alternatively, one or more of the optical paths 112-A to 112-D may comprise at least two non-parallel segments, e.g. non-parallel segments intersecting at one of the beam splitter 902 as in FIG. 9a. In some embodiments, the light guiding system may additionally comprise a reflective coating or a cladding layer (not shown) on the top and/or bottom surface 104A, 104B to form the waveguide. To couple a laser beam 908 into the waveguide, the light guiding system of the sensor chip 900 or the illumination system 506 of the system 500 may comprise one or more focusing elements such as lenses (not shown) to focus the laser beam 908 onto an entrance facet of the waveguide, e.g. on the side face 104C of the substrate as illustrated in FIG. 9b. In some examples, the light guiding system may comprise one or more two-dimensional waveguides (not shown) defining one or more of the optical paths 112-A to 112-D, e.g. a plurality of two-dimensional waveguides extending parallel to each other. In some embodiments, the sensing regions 110 may extend through the entire substrate 104 perpendicular to the top surface 104A as illustrated in FIG. 9b. In other words, the depth of the surface layer 104-I may correspond to the thickness of the substrate 104. In some embodiments, the sensor chip 900 may not comprise a planar waveguide between the top and bottom surfaces 104A, 104B, but the substrate 104 of the sensor chip 900 may for example be similar to the substrate of the sensor chip 100 of FIG. 1 or of the sensor chip 200 of FIG. 2a described above. For this, the thickness of the substrate 104 may for example be increased, e.g. to a value between 100 μm and 1 mm.

In some embodiments, the light guiding system of the sensor chip 900 or the illumination system 506 of the system 500 may comprise one or more diffractive optical elements (not shown) instead of or in addition to the beam splitters 902 and the micromirror 904. Each of the diffractive optical elements may be configured to split an incoming beam of light such as the laser beam 908 into two or more beams by means of diffraction. Each of the diffractive optical elements may for example be configured to imprint a phase pattern and/or an intensity pattern onto the incoming beam, wherein interference between different parts of the incoming beam causes the incoming beam to split into the two or more beams. Each of the diffractive optical elements may e.g. comprise a phase mask and/or a diffraction grating. The light guiding system of the sensor chip 900 or the illumination system 506 of the system 500 may further comprise one or more focusing elements such as one or more lenses, wherein the one or more focusing elements may for example be configured to refract and/or deflect the two or more beams created by the diffractive optical elements, some or all of which may propagate under an angle relative to the incoming beam, to form a pattern of parallel beams, e.g. similar to the one shown in FIG. 9a. For this, a diffractive optical element may for example be arranged in the focal plane of a respective focusing element.

The embodiments of the present invention disclosed herein only constitute specific examples for illustration purposes. The present invention can be implemented in various ways and with many modifications without altering the underlying basic properties. There-fore, the present invention is only defined by the claims as stated below.

LIST OF REFERENCE SIGNS

100—sensor chip
102—samples
104—substrate
104A—top surface of substrate 104
104B—bottom surface of substrate 104
104C, 104D—side faces of substrate 104
104-I—surface layer
106—sample site
108—well layer
110—sensing region
112—optical path
α—vertical entrance angle of optical path
114—broadband reflective coating
116—dichroic reflective coating
200—sensor chip
202, 204—reflective coatings
206—solid immersion lens
β—horizontal entrance angle of optical path
300—sensor chip
302—retroreflecting structure
302A, 302B—angled surfaces
400—sensor chip
402—waveguide
500—system for parallelized magnetic sensing
502—sensor chip
504—mount
506—illumination system
506A—adjustable mirror
506B—beam shaper
508—laser source
510—ingoing optical path
512A, 512B—magnet coils
514—microwave antenna
516—imaging system
518—objective
520—imaging path
522—detector
524—channel of detector 522
600—sensor chip
602—frame
604—lateral opening
606—retroreflecting structure
700—method of probing a plurality of samples using solid-state spin systems
702—step of preparing the samples
704—step of illuminating the sensing regions
706—step of detecting the optical signals
800—method of probing a plurality of samples by nuclear magnetic resonance spectroscopy
802—step of preparing the samples
804—step of applying a bias magnetic field
806—step of illuminating the sensing regions for optical polarization
808—step of applying microwave pulses
810—step of illuminating the sensing regions for optical read-out
812—step of measuring fluorescence intensities
900—sensor chip
902—beam splitter
904—micromirror
906—hydrophilic coating
908—laser beam

What is claimed is:

1. A sensor chip for magnetic sensing of a plurality of samples simultaneously, the sensor chip comprising:
an optically transparent substrate comprising a plurality of optically addressable solid-state spin systems arranged in a plurality of sensing regions in a surface layer below a top surface of the substrate;
a plurality of sample sites, wherein each sample site is arranged above a respective sensing region; and a light guiding system configured to provide an optical path through the substrate connecting each of the sensing regions.

2. A system for magnetic sensing of a plurality of samples simultaneously using a sensor chip, wherein the sensor chip comprises:
an optically transparent substrate comprising a plurality of optically addressable solid-state spin systems arranged in a plurality of sensing regions in a surface layer below a top surface of the substrate;
the system comprising:
a mount configured to receive the sensor chip; and
an illumination system configured to couple a laser beam generated by a laser source into an optical illumination path through the substrate to excite solid-state spin systems in the sensing regions, wherein the illumination path sequentially intersects with each of the sensing regions.

3. The sensor chip of claim 1, wherein the optical path comprises at least two segments that are not parallel to each other.

4. The sensor chip of claim 1, wherein the light guiding system comprises one or more reflective coatings on one or more of the top surface, on a bottom surface and/or on a side face of the substrate.

5. The sensor chip of claim 1, wherein the light guiding system comprises one or more retroreflecting structures on or adjacent to side faces of the substrate, each of the retroreflecting structures comprising a pair of angled surfaces configured to retroreflect a light beam propagating through the substrate along the optical path.

6. The sensor chip of claim 1, wherein the light guiding system comprises a focusing element arranged between sensing regions along the optical path, wherein the focusing element is configured to refocus a light beam propagating along the optical path.

7. The sensor chip of claim 1, wherein the light guiding system comprises a waveguide in the substrate, wherein the waveguide is a planar waveguide configured to confine light propagating along the optical path in a direction perpendicular to the top surface of the substrate.

8. The sensor chip of claim 1, further comprising a plurality of solid immersion lenses on the bottom surface of the substrate, wherein each of the solid immersion lenses is arranged below a respective one of the sensing regions.

9. The sensor chip of claim 1, wherein the sample sites are microfluidic sample wells formed in the top surface of the substrate or in a well layer arranged on the top surface of the substrate.

10. The sensor chip of claim 1, wherein the sensing regions are arranged in a two-dimensional array in the surface layer of the substrate.

11. The sensor chip of claim 1, wherein:
the solid-state spin systems are arranged throughout the entire surface layer of the substrate and the optical path connecting the sensing regions does not intersect with the surface layer outside of the sensing regions; or
a density of the solid-state spin systems in the substrate outside of the sensing regions is at least a factor of 100 smaller than a density of the solid-state spin systems within the sensing regions and at least a part of the optical path extends within the surface layer between the sensing regions.

12. The system of claim 2, wherein the illumination path comprises at least two segments that are not parallel to each other and the laser beam propagating along the illumination path is sequentially reflected off one or both of:
the top surface of the substrate in the vicinity of each of the sensing regions; and
surfaces perpendicular to the top surface of the substrate.

13. The system of claim 2, wherein the illumination path forms a periodic, non-intersecting pattern in a plane parallel to the top surface of the substrate.

14. The system of claim 2, wherein the illumination system comprises one or both of:
one or more focusing elements arranged between sensing regions along the illumination path, wherein the focusing elements are configured to refocus the laser beam propagating along the illumination path; and
a beam shaper configured to convert the laser beam to a Bessel beam.

15. The system of claim 2, wherein:
the sensing regions form a first set of sensing regions and the sensor chip further comprises a second set of sensing regions; and
the illumination system comprises a beam splitter configured to couple the laser beam into a first illumination path sequentially intersecting with each of the sensing regions in the first set and into a second illumination path sequentially intersecting with each of the sensing regions in the second set.

* * * * *